US012777794B2

(12) United States Patent
Kwon et al.

(10) Patent No.: US 12,777,794 B2
(45) Date of Patent: Oct. 27, 2026

(54) DISPLAY DEVICE

(71) Applicant: Samsung Display Co., Ltd., Yongin-si (KR)

(72) Inventors: Hanbum Kwon, Yongin-si (KR); Cholong Won, Yongin-si (KR); Youngmin Ahn, Yongin-si (KR); Sun Oh Jeong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 285 days.

(21) Appl. No.: 18/397,547

(22) Filed: Dec. 27, 2023

(65) Prior Publication Data

US 2024/0224653 A1 Jul. 4, 2024

(30) Foreign Application Priority Data

Jan. 2, 2023 (KR) ........................ 10-2023-0000134

(51) Int. Cl.
*H10K 59/131* (2023.01)

(52) U.S. Cl.
CPC .................................. *H10K 59/131* (2023.02)

(58) Field of Classification Search
CPC .... H10K 59/131; H10K 59/12; H10K 59/129; H10D 86/60; H10D 86/441; H10D 29/142
See application file for complete search history.

(56) References Cited

U.S. PATENT DOCUMENTS 7,714,436 B2 5/2010 Tanaka
8,168,527 B2 5/2012 Lin et al.
11,917,875 B2 2/2024 Youk et al.
2018/0350701 A1* 12/2018 Kim .................. G02F 1/133305
2021/0223818 A1* 7/2021 Jang .......................... B32B 3/06
2023/0247874 A1* 8/2023 Youk .................... H10K 59/131 345/156

FOREIGN PATENT DOCUMENTS

JP H11-67776 3/1999
JP 2001-110831 4/2001
JP 2007-017589 1/2007
JP 2007-188993 7/2007
JP 2007-214164 8/2007
JP 2011-009427 1/2011
KR 20220097712 A 7/2022

* cited by examiner

*Primary Examiner* — Telly D Green
(74) *Attorney, Agent, or Firm* — Lerner David LLP

(57) ABSTRACT

A display device includes a substrate, a pixel disposed on the substrate, a signal line including a line part electrically connected to the pixel and a pad part extending from an end of the line part and having a width greater than a width of the line part, a signal pad disposed on the pad part, and protruding portions disposed between the signal pad and the pad part and protruding upward. The protruding portions are spaced apart from each other and disposed in a substantially zigzag shape.

20 Claims, 24 Drawing Sheets

DISPLAY DEVICE

CROSS-REFERENCE TO RELATED APPLICATION(S)

This application claims priority to and benefits of Korean Patent Application No. 10-2023-0000134 under 35 U.S.C. § 119, filed on Jan. 2, 2023 in the Korean Intellectual Property Office, the entire contents of which are incorporated herein by reference.

BACKGROUND

1. Technical Field

The disclosure relates to a display device.

2. Description of the Related Art

Electronic devices that provide images to a user, such as a smart phone, a digital camera, a notebook computer, a navigation unit, and a smart television, may include a display device to display the images. The display device generates the images and provides the images to the user through a display screen thereof.

The display device may include a display panel displaying the images. The display panel may include gate lines, data lines, and pixels connected to the gate lines and the data lines.

The display panel is connected to a driver that provides electrical signals, which are required to display the images, to the gate lines and the data lines.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides a display device capable of allowing a resin connecting a signal pad and a driver to readily flow outward and reducing defects.

The technical objectives to be achieved by the disclosure are not limited to those described herein, and other technical objectives that are not mentioned herein would be clearly understood by a person skilled in the art from the description of the disclosure.

Embodiments provide a display device that may include a substrate; a pixel disposed on the substrate; a signal line including a line part electrically connected to the pixel and a pad part extending from an end of the line part and having a width greater than a width of the line part; a signal pad disposed on the pad part; and protruding portions disposed between the signal pad and the pad part and protruding upward. The protruding portions are spaced apart from each other and disposed in a substantially zigzag shape.

The protruding portions may overlap the signal pad, and the signal pad covers the protruding portions in a plan view.

The protruding portions may partially overlap the pad part in a plan view.

The display device may further comprise an insulating layer disposed between the signal pad and the pad part, wherein the signal pad is electrically connected to the pad part by at least one contact hole defined through the insulating layer.

The insulating layer may be further disposed between the protruding portions and the pad part.

The protruding portions may not overlap the contact in a plan view.

The display device may further comprise a driver electrically connected to the signal pad, wherein the signal pad comprises contact portions disposed on upper ends of the protruding portions; and a non-contact portion disposed around the contact portions and placed at a lower position than a position of the contact portions, and the driver electrically contacts the contact portions.

The driver may comprise bump electrodes disposed on the contact portions and electrically contacting the contact portions; and an integrated circuit chip disposed on the bump electrodes and electrically connected to the bump electrodes.

The signal line may extend in a first direction, the first direction corresponds to a column direction, the protruding portions disposed in an h-th column are spaced apart from the protruding portions disposed in an (h+1)th column in a second direction intersecting the first direction, the protruding portions disposed in the h-th column are arranged staggered with respect to the protruding portions disposed in the (h+1)th column, and h is a natural number.

The protruding portions may extend in a first diagonal direction or a second diagonal direction, the first diagonal direction intersects the first direction and the second direction on a plane defined by the first direction and the second direction, and the second diagonal direction intersects the first direction and the second direction and the first diagonal direction on the plane.

The protruding portions may be disposed in the h-th column and the protruding portions disposed in the (h+1)th column extend in one of the first diagonal direction and the second diagonal direction.

The protruding portions may be disposed in the h-th column extend in the first diagonal direction, and the protruding portions disposed in the (h+1)th column extend in the second diagonal direction.

The signal pad may comprise a first electrode disposed on the protruding portions.

The signal pad may further comprise a second electrode disposed on the first electrode.

The protruding portions may partially overlap the signal pad, the signal pad covers a side surface of each of the protruding portions and a portion of an upper surface of each of the protruding portions, and the side surface of each of the protruding portions is disposed adjacent to the pad part in a plan view.

The another side surface of each of the protruding portions opposite to the side surface of each of the protruding portions, is exposed outside of the signal pad.

The protruding portions may comprise an organic insulating layer.

Embodiments provide a display device that may include a substrate; a pixel disposed on the substrate; a signal line including a line part electrically connected to the pixel and extending in a first direction and a pad part extending from an end of the line part to the first direction and having a width greater than a width of the line part; a signal pad disposed on the pad part; and protruding portions disposed between the signal pad and the pad part and protruding upward. The protruding portions are disposed in the first direction along edges of both sides of the pad part, opposite to each other in a second direction intersecting the first direction, and the protruding portions overlapping a side of the both sides of the pad part are spaced apart from and disposed staggered with respect to the protruding portions overlapping the other side of the both sides of the pad part in a plan view. The protruding portions may overlap the signal pad, and the signal pad covers the protruding portions in a plan view.

The protruding portions may partially overlap the signal pad, the signal pad covers a side surface of each of the protruding portions and a portion of an upper surface of each of the protruding portions, and the side surface of each of the protruding portions is disposed adjacent to the pad part.

According to the above, plural protruding portions are disposed between the signal pad and the signal line. The protruding portions are spaced apart from each other and arranged in the zigzag shape. As the protruding portions are spaced apart from each other, a resin including an adhesive material readily flows outward, and thus, defects caused by the resin are reduced.

According to the above, when viewed in a plane, the protruding portions partially overlap the signal line. The protruding portions are spaced apart from a center of the signal line and are disposed at an edge of the signal line when viewed in the plane. The signal pad is disposed on the protruding portions. Accordingly, in a process of contacting a driver with the signal pad, the driver makes contact with the signal pad disposed on the protruding portions even though the driver is spaced apart from the center of the signal line due to an error. Accordingly, a rate of defects when the driver and the signal pad are not in contact is reduced.

BRIEF DESCRIPTION OF THE DRAWINGS

The above and other advantages will become readily apparent by reference to the following detailed description when considered in conjunction with the accompanying drawings wherein.

DETAILED DESCRIPTION OF THE EMBODIMENTS

Figure 1:
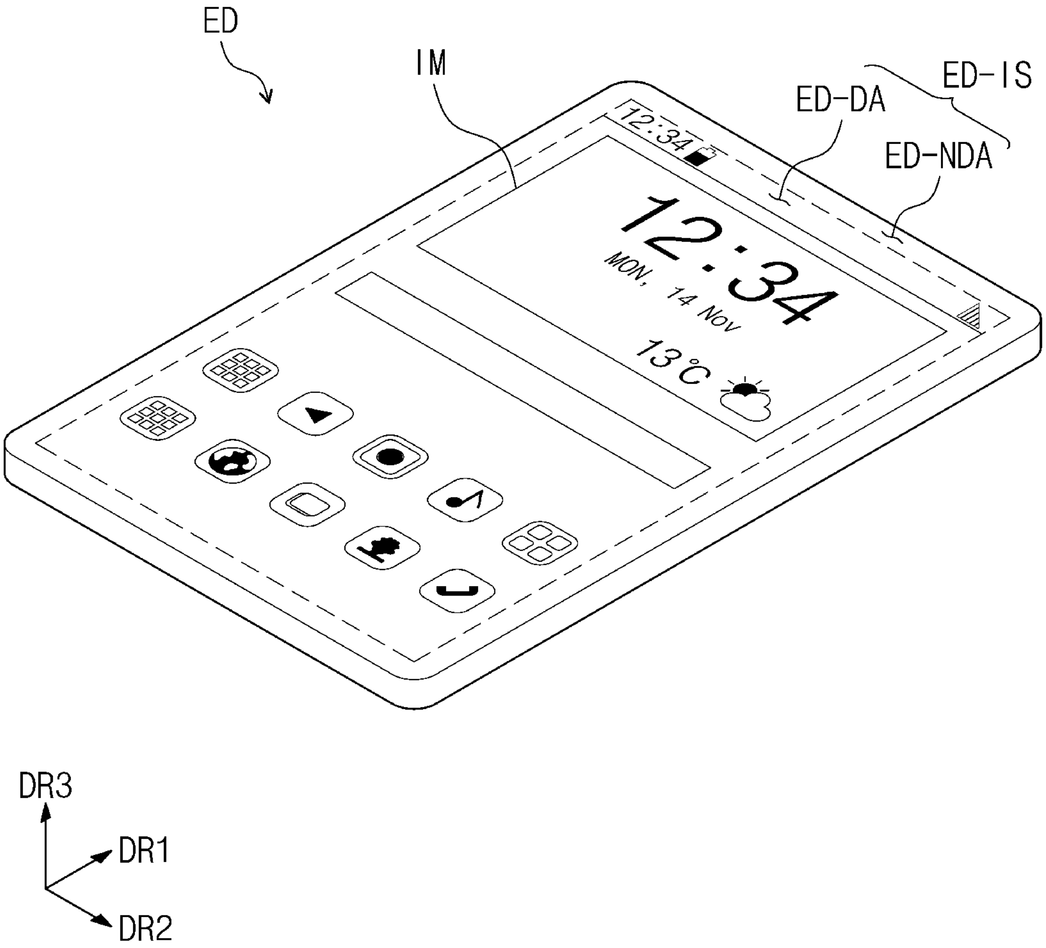
FIG. 1 is a schematic perspective view of an electronic device according to an embodiment.

Features of the disclosure and methods of accomplishing the same may be understood more readily by reference to the following detailed description of embodiments and the accompanying drawings. The disclosure may, however, be embodied in many different forms and should not be construed as being limited to the embodiments set forth herein. Rather, these embodiments are provided so that this disclosure will be through and complete and will fully convey the disclosure to those skilled in the art, and the disclosure will be defined by the appended claims. Like reference numerals denote like elements throughout the specification.

In the specification and the claims, the term “and/or” is intended to include any combination of the terms “and” and “or” for the purpose of its meaning and interpretation. For example. “A and/or B” may be understood to mean “A, B, or A and B.” The terms “and” and “or” may be used in the conjunctive or disjunctive sense and may be understood to be equivalent to “and/or.

In the specification and the claims, the phrase “at least one of” is intended to include the meaning of “at least one selected from the group of” for the purpose of its meaning and interpretation. For example, “at least one of A and B” may be understood to mean “A, B, or A and B.

In the disclosure, it will be understood that when an element or layer is referred to as being “on”, “connected to” or “coupled to” another element or layer, it can be directly on, connected or coupled to the other element or layer or intervening elements or layers may be present.

Spatially relative terms, such as “beneath”, “below”, “lower”, “above”, “upper” and the like, may be used herein for ease of description to describe one element or feature’s relationship to another element(s) or feature(s) as illustrated in the figures. It will be understood that the spatially relative terms are intended to encompass different orientations of the device in use or operation in addition to the orientation depicted in the figures.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the disclosure.

The terms “overlap” or “overlapped” mean that a first object may be above or below or to a side of a second object, and vice versa. Additionally, the term “overlap” may include layer, stack, face or facing, extending over, covering, or partly covering or any other suitable term as would be appreciated and understood by those of ordinary skill in the art.

When an element is described as ‘not overlapping’ or ‘to not overlap’ another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

As used herein, the singular forms, "a," "an," and "the" are intended to include the plural forms as well, unless the context clearly indicates otherwise.

Unless explicitly described to the contrary, "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

Embodiments described in the disclosure are described with reference to schematic plan views and schematic cross-sectional views that are illustrated schematic diagrams. Accordingly, shapes of the views may vary depending on manufacturing technologies and/or tolerances. Thus, embodiments are not limited to illustrated forms and also include variations in form produced according to manufacturing processes. Therefore, regions illustrated in the drawings are examples, and the shapes of the regions illustrated in the drawings are intended to illustrate the example shapes of the regions of elements and not to limit the scope of the disclosure.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within +30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments will be described with reference to accompanying drawings.

FIG. 1 is a schematic perspective view of an electronic device ED according to an embodiment.

Referring to FIG. 1, the electronic device ED may have a rectangular shape defined by long sides extending in a first direction DR1 and short sides extending in a second direction DR2 intersecting the first direction DR1. However, the shape of the electronic device ED should not be limited to the rectangular shape, and the electronic device ED may have various shapes, such as a circular shape and a polygonal shape.

Hereinafter, a direction substantially perpendicular to a plane defined by the first direction DR1 and the second direction DR2 may be referred to as a third direction DR3. In the disclosure, the expression "when viewed in a plane" may mean a state of being viewed in the third direction DR3.

An upper surface of the electronic device ED may be referred to as a display surface ED-IS, and the display surface ED-IS may be a plane defined by the first direction DR1 and the second direction DR2. Images IM generated by the electronic device ED may be provided to a user through the display surface ED-IS.

The display surface ED-IS may include a display area ED-DA and a non-display area ED-NDA around the display area ED-DA. The images IM may be displayed through the display area ED-DA and may not be displayed through the non-display area ED-NDA. The non-display area ED-NDA may surround or may be adjacent to the display area ED-DA and may define an edge of the electronic device ED, which is printed by a given color.

Figure 2:
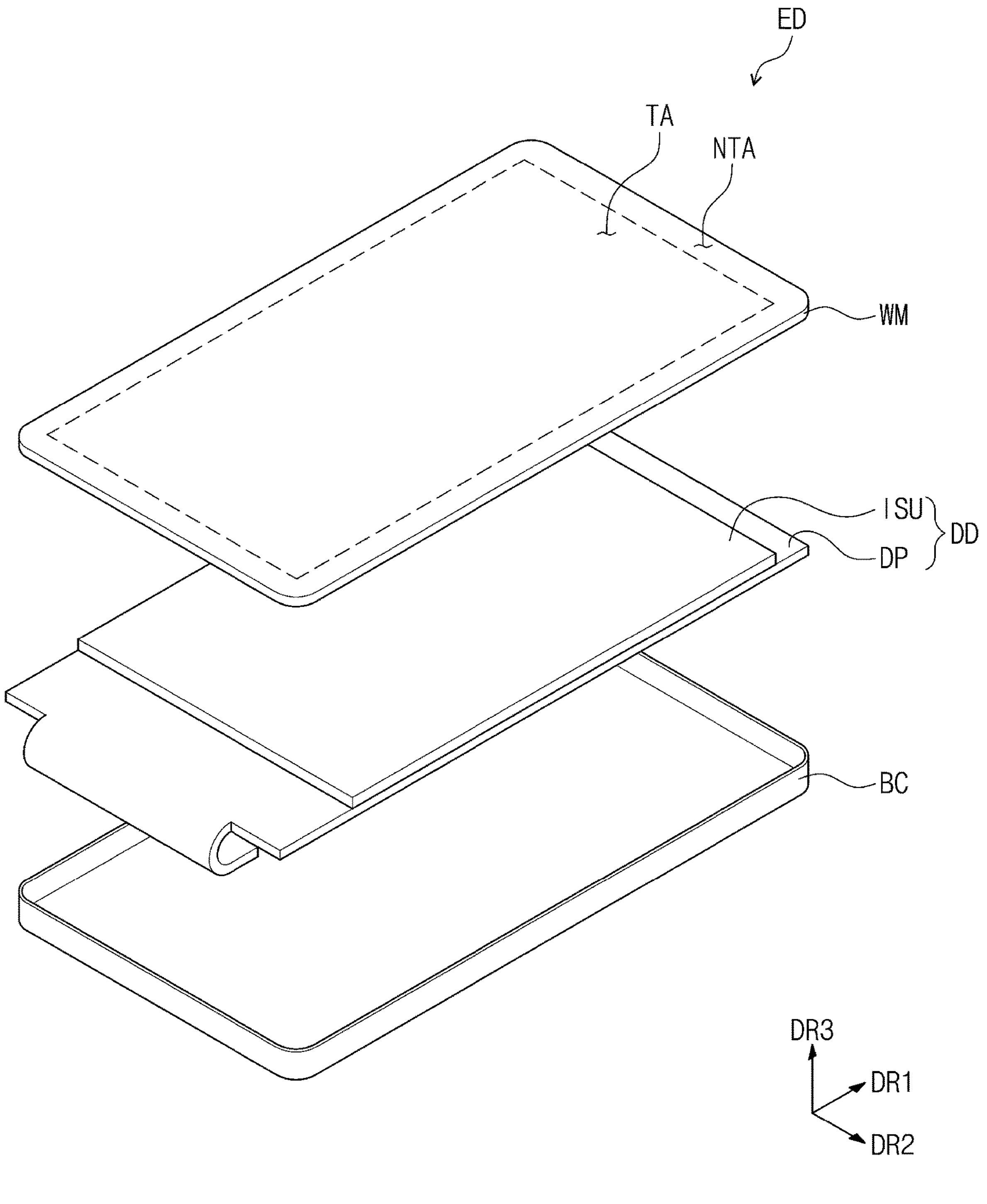
FIG. 2 is an exploded schematic perspective view of an electronic device according to an embodiment.

FIG. 2 is an exploded perspective view of the electronic device ED according to an embodiment.

Referring to FIG. 2, the electronic device ED may include a window WM, a display device DD, and a housing BC. The housing BC may accommodate the display device DD and may be coupled or connected to the window WM. Although not shown in figures, the electronic device ED may further include other electronic modules accommodated in the housing BC and electrically connected to a display panel DP. For instance, the electronic device ED may further include a main board, a circuit module mounted on the main board, a camera module, a power module, and the like within the spirit and the scope of the disclosure.

The window WM may be disposed above the display device DD. The window WM may transmit the image provided from the display device DD to the outside. The window WM may include a transmission area TA and a non-transmission area NTA. The transmission area TA may overlap the display area ED-DA of FIG. 1. The transmission area TA may have a shape corresponding to that of the display area ED-DA.

The non-transmission area NTA may overlap the non-display area ED-NDA and may have a shape corresponding to that of the non-display area ED-NDA. The non-transmission area NTA may have a relatively low light transmittance compared with that of the transmission area TA.

The display device DD may generate the image and may sense an external input. The display device DD may include the display panel DP and an input sensor ISU. Although not shown in figures, the display device DD may further include an anti-reflective member disposed on the input sensor ISU. The anti-reflective member may include a polarizer and a retarder or may include a color filter and a black matrix.

The display panel DP may be a light emitting type display panel, however, it should not be particularly limited. For instance, the display panel DP may be an organic light emitting display panel or an inorganic light emitting display panel. A light emitting layer of the organic light emitting display panel may include an organic light emitting material. A light emitting layer of the inorganic light emitting display panel may include a quantum dot, a quantum rod, or a nano-LED. Hereinafter, the organic light emitting display panel will be described as a representative example of the display panel DP.

The input sensor ISU may include one of a capacitive sensor, an optical sensor, an ultrasonic sensor, and an electromagnetic induction sensor. The input sensor ISU may be formed on the display panel DP through successive processes or may be attached to an upper portion of the display panel DP using an adhesive layer after being separately manufactured.

FIG. 2 shows the structure in which a circuit board PB is bent, however, the disclosure should not be limited thereto or thereby. The display panel DP may be partially bent to allow a driver DC to face downward. A non-display area of the display panel DP may be bent.

Figure 3:
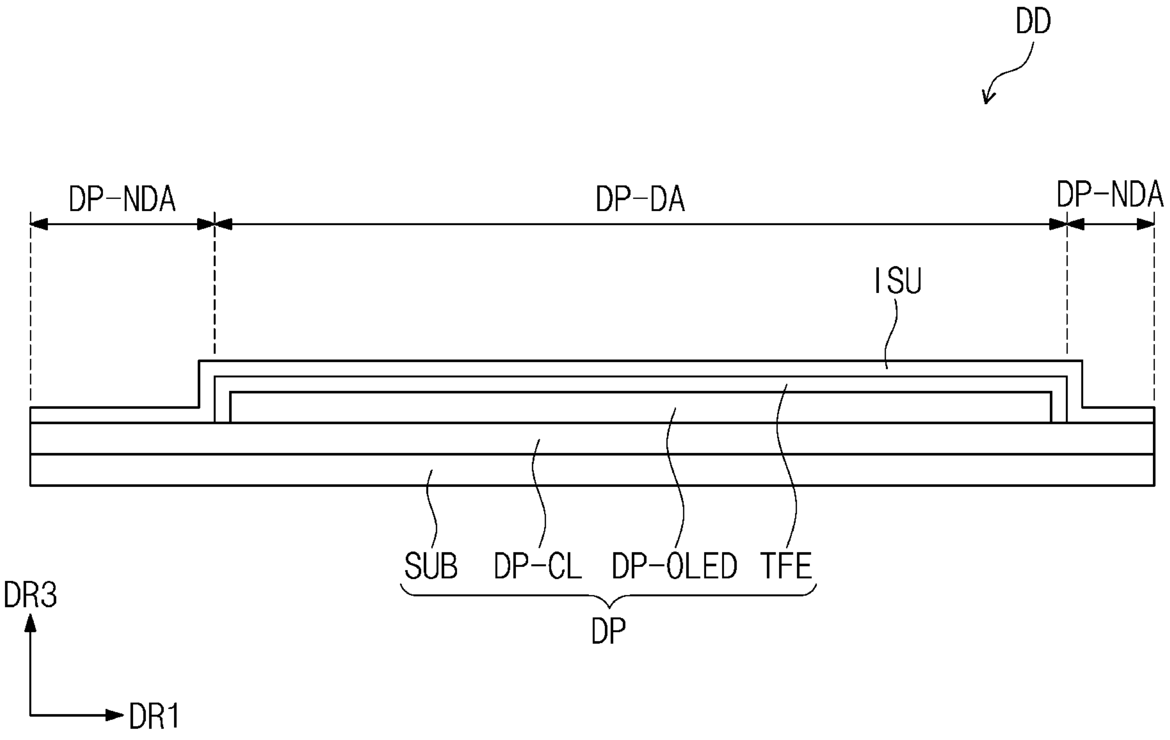
FIG. 3 is a schematic cross-sectional view of a display device according to an embodiment.

FIG. 3 is a schematic cross-sectional view of the display device DD according to an embodiment.

Referring to FIG. 3, the display panel DP may include a substrate SUB, a circuit element layer DP-CL, a display element layer DP-OLED, and a thin film encapsulation layer TFE, which may be sequentially stacked each other on the substrate SUB. The input sensor ISU may be disposed on the thin film encapsulation layer TFE.

The substrate SUB may include a display area DP-DA and a non-display area DP-NDA around the display area DP-DA. The substrate SUB may include a flexible plastic material such as a glass or polyimide (PI). The display element layer DP-OLED may be disposed in the display area DP-DA.

Pixels may be arranged (or disposed) in the circuit element layer DP-CL and the display element layer DP-OLED. Although not shown in figures, each of the pixels may include transistors and at least one capacitor, which are arranged in the circuit element layer DP-CL, and a light emitting element disposed in the display element layer DP-OLED and connected to the transistor.

The thin film encapsulation layer TFE may be disposed on the circuit element layer DP-CL to cover the display element layer DP-OLED. The thin film encapsulation layer TFE may protect the pixels from moisture, oxygen, and a foreign substance such as dust particles.

Figure 4:
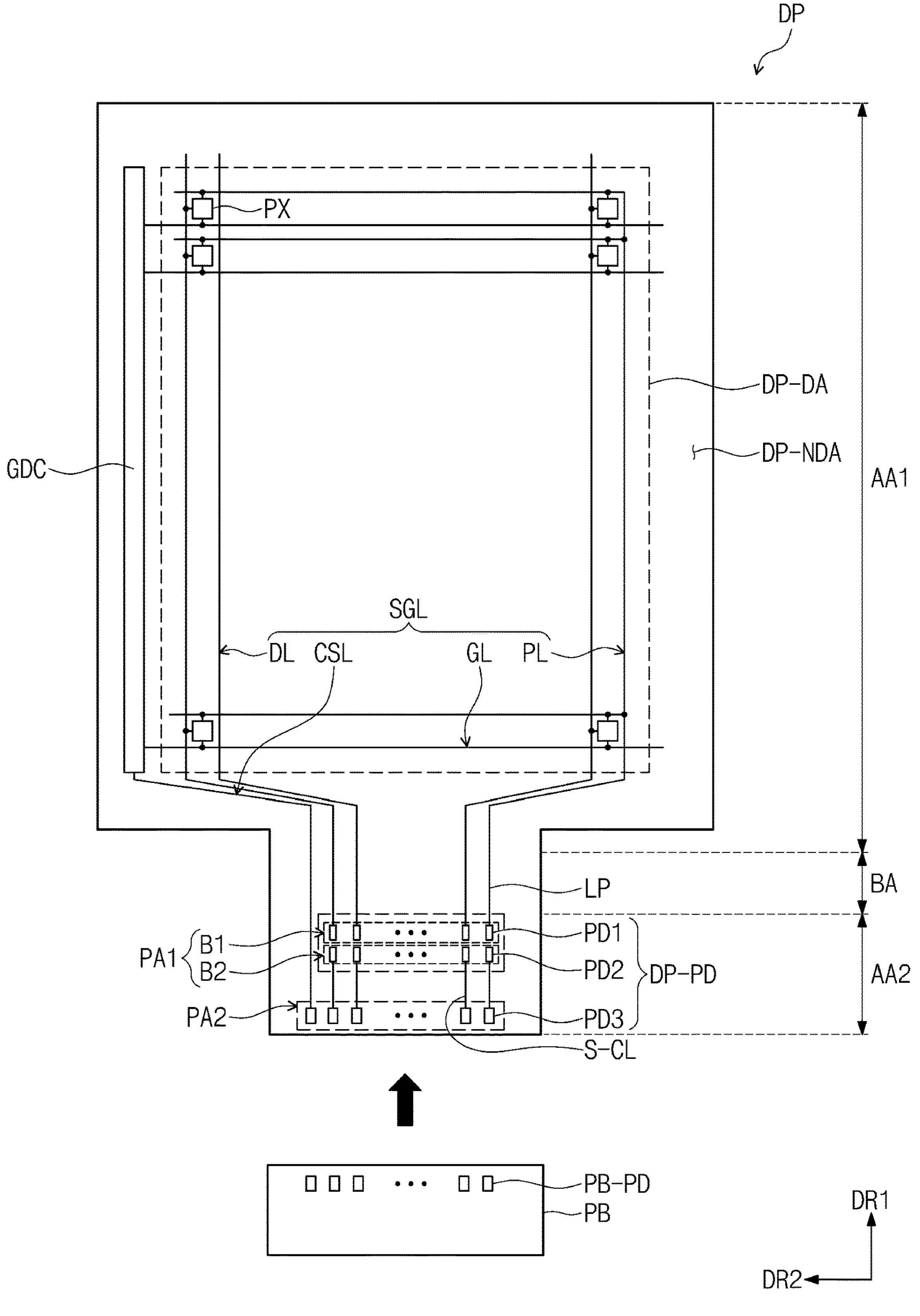
FIG. 4 is a schematic plan view of a display panel shown in FIG. 3.

FIG. 4 is a schematic plan view of the display panel DP shown in FIG. 3.

Referring to FIG. 4, the display panel DP may include pixels PX, a gate driving circuit GDC, signal lines SGL, and signal pads DP-PD.

The display panel DP may include a first portion AA1, a second portion AA2, and a bending portion BA defined between the first portion AA1 and the second portion AA2. The first portion AA1, the bending portion BA, and the second portion AA2 may be arranged in a direction parallel to the first direction DR1, and the bending portion BA may extend in the second direction DR2. The bending portion BA may extend from the first portion AA1 to the direction parallel to the first direction DR1, and the second portion AA2 may extend from the bending portion BA to the direction parallel to the first direction DR1.

The first portion AA1 may include long sides extending in the first direction DR1 and opposite to each other in the second direction DR2. The bending portion BA and the second portion AA2 may have a length shorter than a length of the first portion AA1 in the second direction DR2.

The pixels PX may be arranged in the display area DP-DA. Each of the pixels PX may include an organic light emitting element and a pixel driving circuit connected to the organic light emitting element. The gate driving circuit GDC may sequentially output gate signals to gate lines GL described later. The gate driving circuit GDC may include a transistor formed through the same process, for example, a low temperature polycrystalline silicon (LTPS) process or a low temperature polycrystalline oxide (LTPO) process, as a transistor of the pixel PX. The display panel DP may further include another driving circuit to apply a light emission control signal to the pixels PX.

The signal lines SGL may include the gate lines GL, data lines DL, a power line PL, and a control signal line CSL. Each of the gate lines GL may be connected to a corresponding pixel PX among the pixels PX, and each of the data lines DL may be connected to a corresponding pixel PX among the pixels PX. The power line PL may be connected to the pixels PX. The control signal line CSL may provide control signals to the gate driving circuit GDC.

The signal lines SGL may overlap the display area DP-DA and the non-display area DP-NDA. Each of the signal lines SGL may include a line part LP. Although not shown in figures, the signal lines SGL may further include a pad part. The line part LP may overlap the display area DP-DA and the non-display area DP-NDA. The pad part may be connected to an end of the line part LP. A connection relationship between the pad part and the line part LP will be described in detail with reference to FIG. 11.

The signal pads DP-PD may include first pads PD1, second pads PD2, and third pads PD3. An area in which the first pads PD1 and the second pads PD2 are disposed may be referred to as a first pad area PA1, and an area in which the third pads PD3 are disposed may be referred to as a second pad area PA2.

Figure 7:
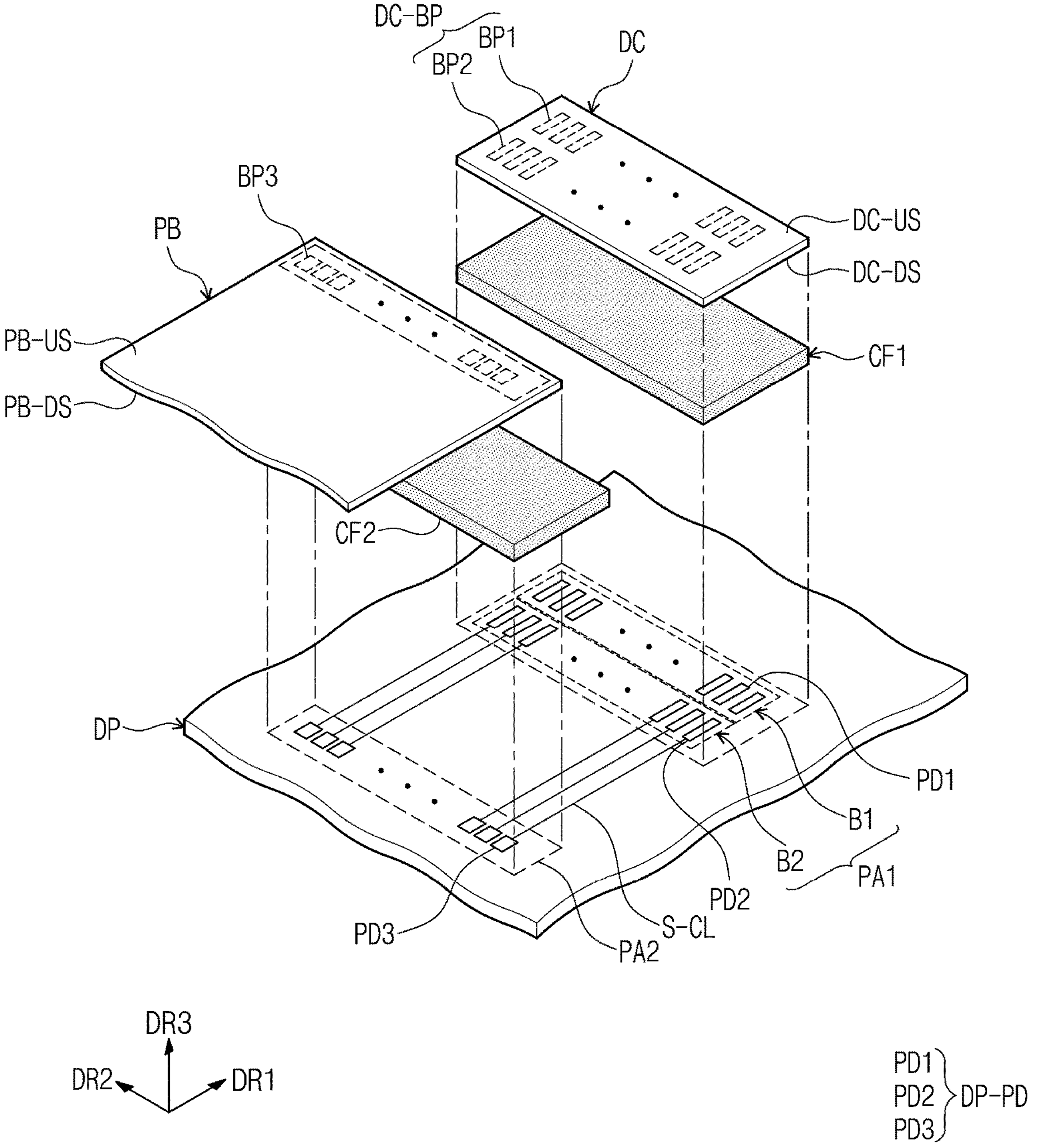
FIG. 7 is an enlarged schematic perspective view of a pad area shown in FIG. 4.

The first pad area PA1 may be an area overlapping the driver DC of FIG. 7, and the second pad area PA2 may be an area overlapping the circuit board PB. The first pad area PA1 may include a first area B1 in which the first pads PD1 are disposed and a second area B2 in which the second pads PD2 are disposed. The first pad area PA1 and the second pad area PA2 may be disposed in the non-display area DP-NDA. The first pad area PA1 and the second pad area PA2 may be spaced apart from each other in the first direction DR1.

Each of the first pads PD1 may be connected to a corresponding data line DL among the data lines DL. Although not shown in figures, the first pads PD1 and the second pads PD2 may be electrically connected to each other. The second pads PD2 may be connected to the third pads PD3 via connection signal lines S-CL.

The circuit board PB may include circuit pads PB-PD. The circuit pads PB-PD may be arranged in the second direction DR2. The circuit pads PB-PD of the circuit board PB may be connected to the third pads PD3 of the second pad area PA2.

Figure 5:
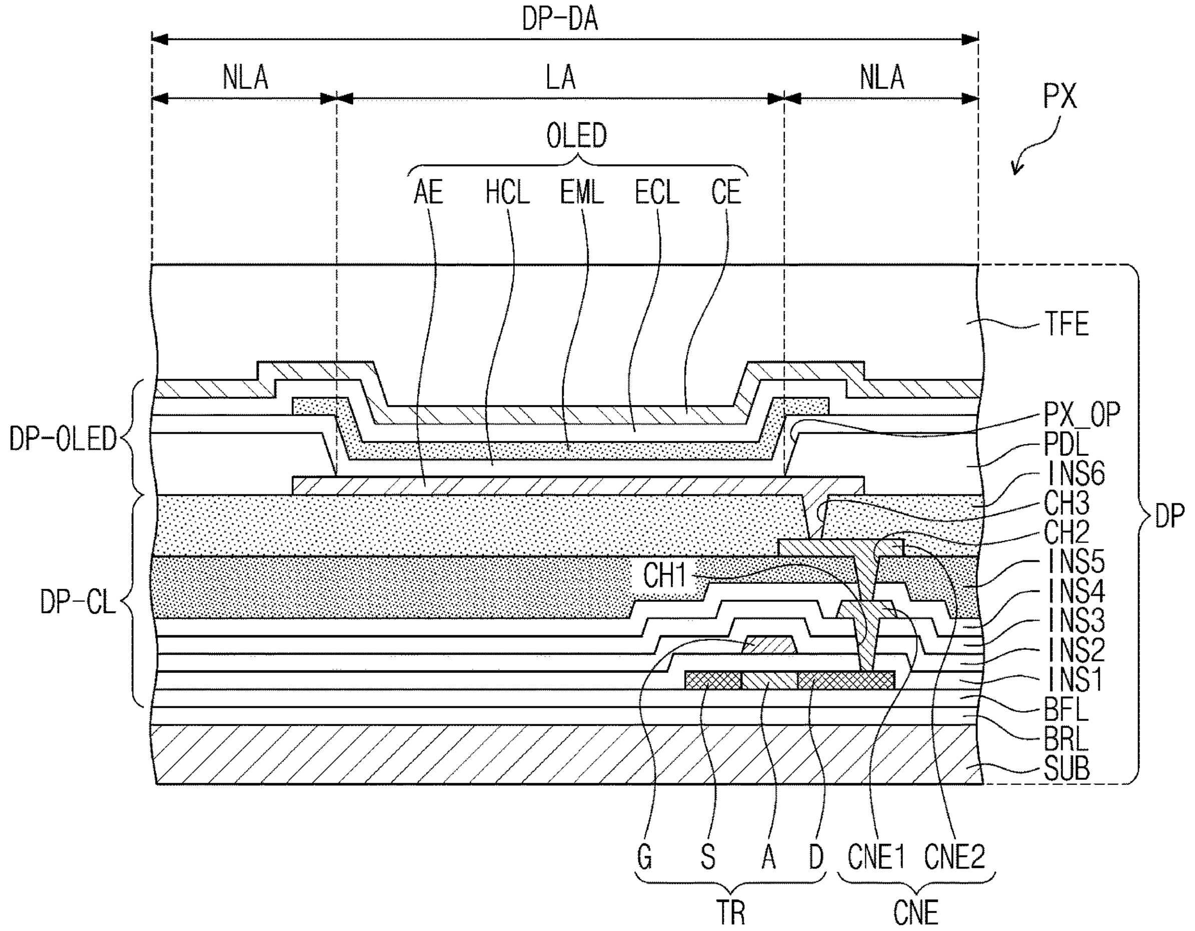
FIG. 5 is a schematic cross-sectional view of a pixel according to an embodiment.

FIG. 5 is a schematic cross-sectional view of a pixel PX according to an embodiment.

Referring to FIGS. 4 and 5, the pixel PX may include a transistor TR and a light emitting element OLED. The light emitting element OLED may include a first electrode (or an anode) AE, a second electrode (or a cathode) CE, a hole control layer HCL, an electron control layer ECL, and a light emitting layer EML.

The transistor TR and the light emitting element OLED may be disposed on the substrate SUB. As an example, one transistor TR is shown in FIG. 5, however, the pixel PX may include transistors and at least one capacitor to drive the light emitting element OLED. The transistors and the one capacitor may be connected to each other.

The display area DP-DA may include a light emitting area LA corresponding to each pixel PX and a non-light-emitting area NLA around the light emitting area LA. The light emitting element OLED may be disposed in the light emitting area LA.

The substrate SUB may include a flexible plastic material such as polyimide (PI). A barrier layer BRL may be disposed on the substrate SUB. A buffer layer BFL may be disposed on the barrier layer BRL. The barrier layer BRL and the buffer layer BFL may be an inorganic layer.

A semiconductor pattern may be disposed on the buffer layer BFL. The semiconductor pattern may include polycrystalline silicon, amorphous silicon, or metal oxide. The semiconductor pattern may be doped with an N-type dopant or a P-type dopant. The semiconductor pattern may include a high-doped region and a low-doped region. The high-doped region may have a conductivity greater than that of the low-doped region and may substantially serve as a source electrode and a drain electrode of the transistor TR. The low-doped region may substantially correspond to an active (or a channel) of the transistor TR.

A source S, an active A, and a drain D of the transistor TR may be formed from the semiconductor pattern. A first insulating layer INS1 may be disposed on the semiconductor pattern. A gate G of the transistor TR may be disposed on the first insulating layer INS1. A second insulating layer INS2 may be disposed on the gate G. A third insulating layer INS3 may be disposed on the second insulating layer INS2.

A connection electrode CNE may include a first connection electrode CNE1 and a second connection electrode CNE2 to connect the transistor TR to the light emitting element OLED. The first connection electrode CNE1 may be disposed on the third insulating layer INS3 and may be connected to the drain D via a first contact hole CH1 defined through the first, second, and third insulating layers INS1, INS2, and INS3.

A fourth insulating layer INS4 may be disposed on the first connection electrode CNE1. A fifth insulating layer INS5 may be disposed on the fourth insulating layer INS4. The second connection electrode CNE2 may be disposed on the fifth insulating layer INS5. The second connection electrode CNE2 may be connected to the first connection electrode CNE1 via a second contact hole CH2 defined through the fourth insulating layer INS4 and the fifth insulating layer INS5. The second connection electrode CNE2 may be the data line DL of FIG. 4.

A sixth insulating layer INS6 may be disposed on the second connection electrode CNE2. Each layer from the buffer layer BFL to the sixth insulating layer INS6 may be defined as the circuit element layer DP-CL. Each of the first to sixth insulating layers INS1 to INS6 may be an inorganic layer or an organic layer.

The first electrode AE may be disposed on the sixth insulating layer INS6. The first electrode AE may be connected to the second connection electrode CNE2 via a third contact hole CH3 defined through the sixth insulating layer INS6. The first electrode AE may be connected to the transistor TR via the first and second connection electrodes CNE1 and CNE2. A pixel definition layer PDL may be disposed on the first electrode AE and the sixth insulating layer INS6. The pixel definition layer PDL may be provided with an opening PX_OP defined therethrough to expose a portion of the first electrode AE.

The hole control layer HCL may be disposed on the first electrode AE and the pixel definition layer PDL. The hole control layer HCL may include a hole transport layer and a hole injection layer.

The light emitting layer EML may be disposed on the hole control layer HCL. The light emitting layer EML may be disposed in an area corresponding to the opening PX_OP. The light emitting layer EML may include an organic material and/or an inorganic material. The light emitting layer EML may generate a light having one of red, green, and blue colors.

The electron control layer ECL may be disposed on the light emitting layer EML and the hole control layer HCL. The electron control layer ECL may include an electron transport layer and an electron injection layer. The hole control layer HCL and the electron control layer ECL may be commonly disposed in the light emitting area PA and the non-light-emitting area NPA.

The second electrode CE may be disposed on the electron control layer ECL. The second electrode CE may be commonly disposed over the pixels PX. A layer on which the light emitting element OLED is disposed may be referred to as the display element layer DP-OLED.

The thin film encapsulation layer TFE may be disposed on the second electrode CE to cover the pixel PX. Although not shown in figures, the thin film encapsulation layer TFE may include layers. Some or a number of the layers may include an inorganic insulating layer and may protect the pixel PX from moisture and oxygen. The other of the layers may include an organic insulating layer and may protect the pixel PX from a foreign substance such as dust particles.

A first voltage may be applied to the first electrode AE via the transistor TR, and a second voltage having a level lower than the first voltage may be applied to the second electrode CE. Holes and electrons injected into the light emitting layer EML may be recombined to generate excitons, and the light emitting element OLED may emit the light by the excitons that return to a ground state from an excited state.

Figure 6:
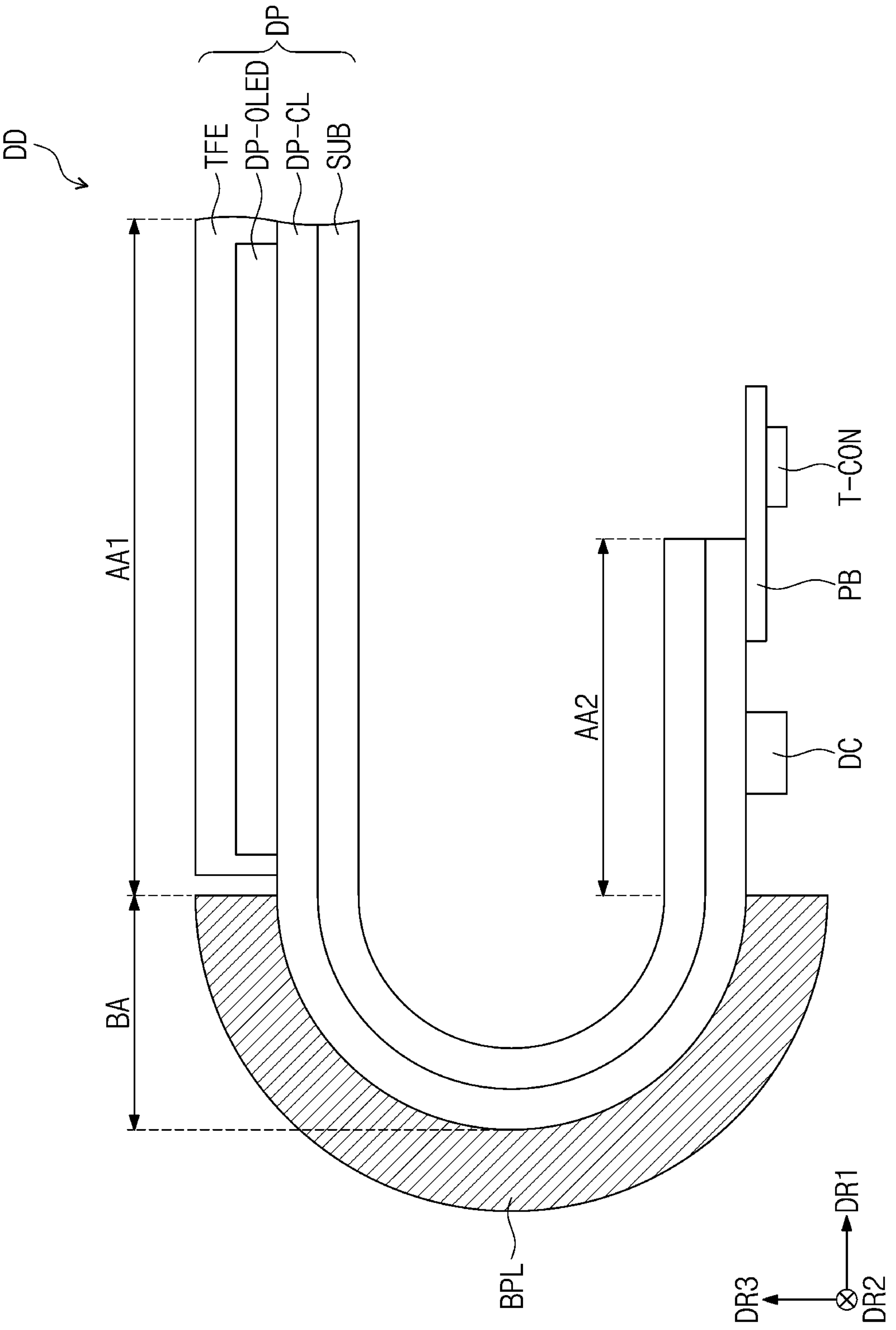
FIG. 6 is a view showing a bent state of a bending portion shown in FIG. 4.

FIG. 6 is a view showing a bent state of the bending portion shown in FIG. 4.

As an example, FIG. 6 is a side view of the display device DD when viewed in the second direction DR2.

A substrate SUB, a circuit element layer DP-CL, a display element layer DP-OLED, and a thin film encapsulation layer TFE of FIG. 6 are substantially the same as the substrate SUB, the circuit element layer DP-CL, the display element layer DP-OLED, and the thin film encapsulation layer TFE of FIG. 5, and thus, details thereof will be omitted or briefly described.

The display device DD may include a driver DC, a circuit board PB, a bending protective layer BPL, and a timing controller T-CON.

The driver DC may be mounted on the display panel DP, however, the disclosure should not be limited thereto or thereby. The driver DC may generate a driving signal required to operate the display panel DP based on a control signal provided from the circuit board PB.

The circuit board PB may be disposed at one end or an end of the substrate SUB and may be electrically connected to the circuit element layer DP-CL. The timing controller T-CON may be disposed on the circuit board PB. The timing controller T-CON may be formed as an integrated circuit chip and may be mounted on an upper surface of the circuit board PB.

The bending portion BA may be bent to allow the second portion AA2 to be disposed under or below the first portion AA1. Accordingly, the driver DC, the circuit board PB, and the timing controller T-CON may be disposed under or below the first portion AA1. The circuit board PB bonded to the display panel DP may be bent and may be disposed on a rear surface of the display panel DP.

The bending protective layer BPL may be disposed in the bending portion BA. The bending protective layer BPL may be disposed adjacent to edges of the first and second portions AA1 and AA2. The bending protective layer BPL may be disposed spaced apart from the thin film encapsulation layer TFE in the first direction DR1. The bending protective layer BPL may be bent together with the bending portion BA in case that the display panel DP is bent.

FIG. 7 is an enlarged perspective view of the pad area shown in FIG. 4.

As an example, FIG. 7 shows the driver DC and the circuit board PB, which are illustrated separate from the display panel DP.

The first pads PD1, the second pads PD2, the connection signal lines S-CL, and the third pads PD3 of FIG. 7 are substantially the same as the first pads PD1, the second pads PD2, the connection signal lines S-CL, and the third pads PD3 of FIG. 4, and thus, details thereof will be omitted or briefly described.

Referring to FIGS. 4 and 7, the driver DC may be attached to the first pad area PA1 by a first adhesive layer CF1. The circuit board PB may be attached to the second pad area PA2 by a second adhesive layer CF2. The first and second adhesive layers CF1 and CF2 may include a synthetic resin with an adhesive property.

In case that the first adhesive layer CF1 is cured, the first and second pads PD1 and PD2 may be attached to and fixed to bump electrodes DC-BP. In case that the second adhesive layer CF2 is cured, the third pads PD3 may be attached to and fixed to third bump electrodes BP3.

The driver DC may be disposed on the first and second pads PD1 and PD2. The driver DC may include an upper surface DC-US and a lower surface DC-DS. The lower surface DC-DS of the driver DC may face the first and second pads PD1 and PD2. The driver DC may include the bump electrodes DC-BP electrically connected to the first pads PD1 disposed on the substrate SUB. The bump electrodes DC-BP may be disposed on the lower surface DC-DS of the driver DC.

The bump electrodes DC-BP may include first bumps BP1 and second bumps BP2. The first bumps BP1 may be spaced apart from the second bumps BP2 in the first direction DR1. The first bumps BP1 may be arranged in the second direction DR2. The second bumps BP2 may be arranged in the second direction DR2. Although not shown in figures, the first bumps BP1 and the second bumps BP2 may protrude from the lower surface DC-DS of the driver DC and may be exposed to the outside.

In case that the driver DC moves in the third direction DR3, the first bumps BP1 may be in contact with and electrically connected to the first pads PD1 and the second bumps BP2 may be in contact with and electrically connected to the second pads PD2. The connection between the bump electrodes DC-BP and the first and second pads PD1 and PD2 will be described in detail with reference to FIG. 11.

Although not shown in figures, the driver DC may include an integrated circuit. The integrated circuit may be disposed on the bump electrodes DC-BP. The integrated circuit may be connected to the bump electrodes DC-BP. The driver DC may receive first signals from the outside via the second pads PD2 and the second bumps BP2. The driver DC may provide second signals generated based on signals to the first pads PD1 via the first bumps BP1. The first signals may be image signals that are digital signals provided from the outside, and the second signals may be data signals that are analog signals. The driver DC may generate analog voltages corresponding to grayscale values of the image signals. The data signals may be applied to the pixels PX via the data line DL shown in FIG. 4.

The circuit board PB may be disposed on the display panel DP. The circuit board PB may be disposed on the third pads PD3. The circuit board PB may include an upper surface PB-US and a lower surface PB-DS. The lower surface PB-DS of the circuit board PB may face the third pads PD3. The circuit board PB may include third bumps BP3 electrically connected to the third pads PD3. The third bumps BP3 may be disposed on the lower surface PB-US of the circuit board PB. The third bumps BP3 may be arranged in the second direction DR2. The circuit board PB may provide the image signals, a driving voltage, and other control signals to the driver DC.

Figure 8:
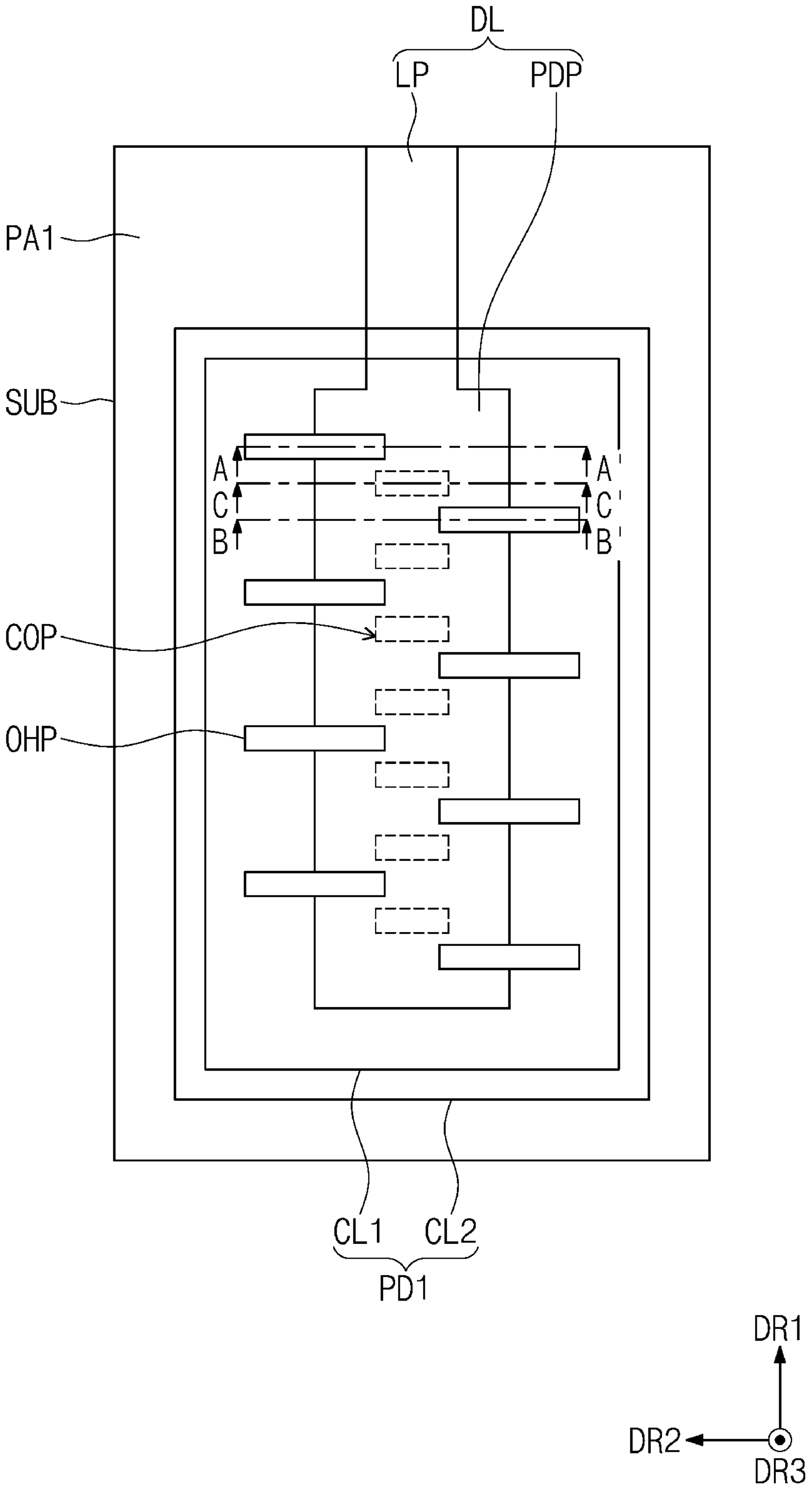
FIG. 8 is an enlarged schematic plan view of a first pad shown in FIG. 7.
Figure 9A:
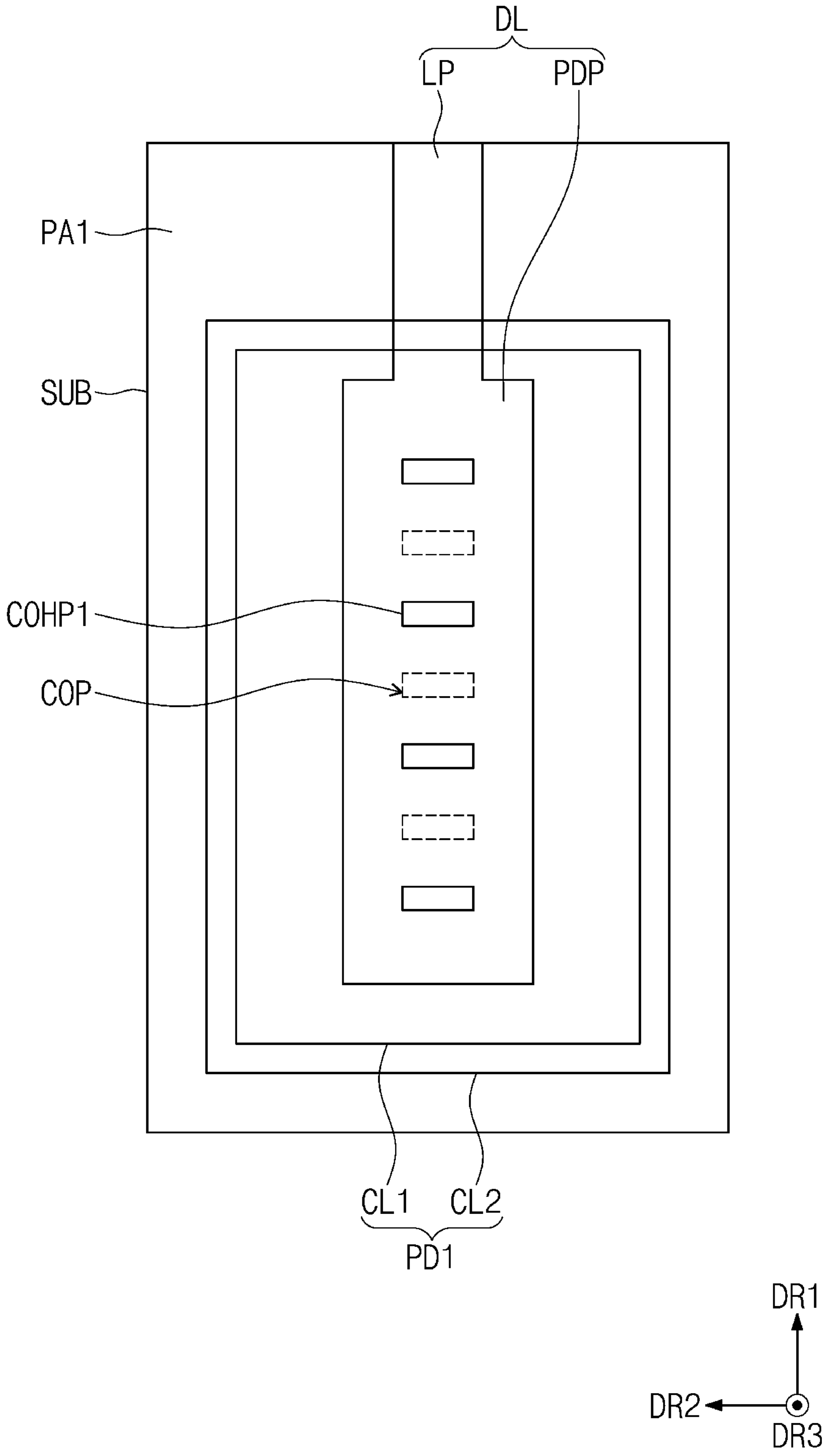
FIGS. 9A to 9C are views of signal pads and signal lines according to comparative examples.
Figure 9B:
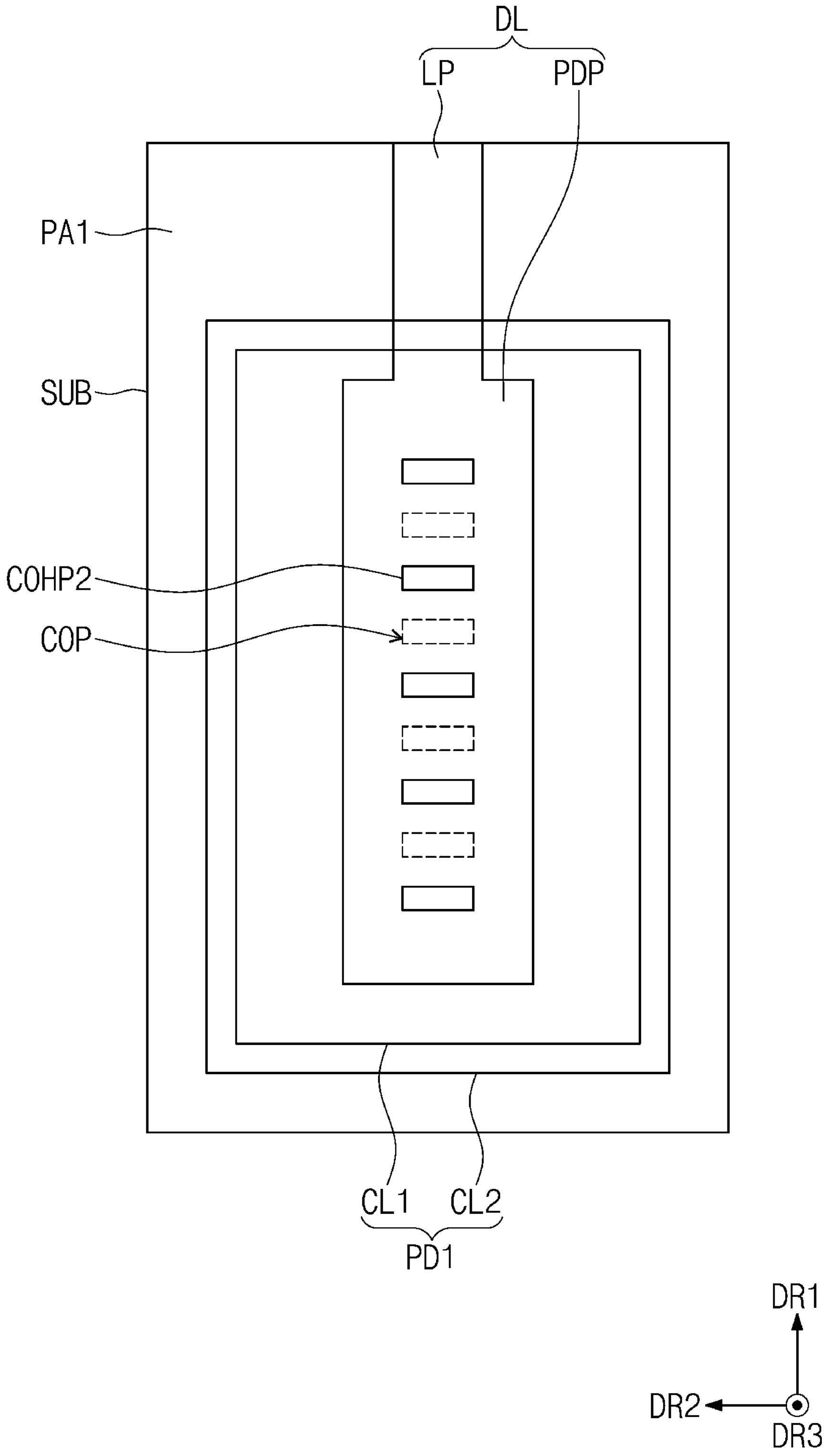
Figure 9C:
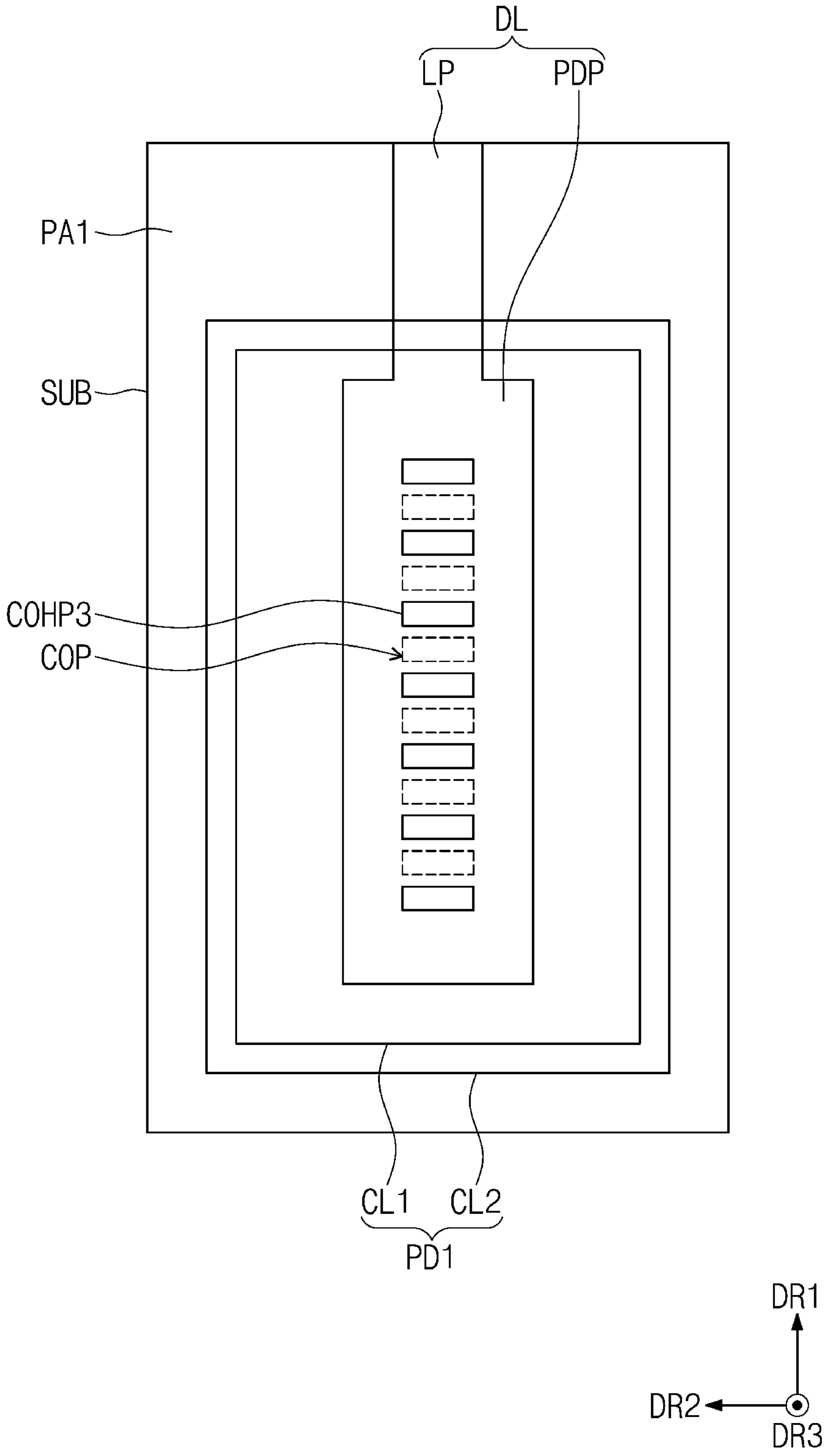

FIG. 8 is an enlarged schematic plan view of the first pad shown in FIG. 7. FIGS. 9A to 9C are views of signal pads and signal lines according to comparative examples.

As an example, FIG. 8 shows only the first pad PD1 disposed on the first pad area PA1, however, the second pad PD2 (refer to FIG. 7) and the third pad PD3 (refer to FIG. 7) may have substantially the same structure as that of the first pad PD1.

As an example, FIGS. 9A to 9C are schematic plan views.

As an example, in FIG. 8, the data line DL is shown as an example of the signal lines SGL of FIG. 4, however, other signal lines may have the same structure.

Referring to FIGS. 4 and 8, the data lines DL may include line parts LP and pad parts PDP. Each of the line parts LP may be connected to a corresponding pixel PX among the pixels PX. Each of the line parts LP may extend in the first direction DR1 and may be connected to a corresponding signal pad DP-PD among the signal pads DP-PD. Hereinafter, descriptions will be made based on one data line DL.

The pad part PDP may extend from an end of the line part LP to the first direction DR1. Although not shown in figures, the pad part PDP and the line part LP of the data line DL may be disposed on different layers from each other and may be connected to each other. A width in the second direction DR2 of the pad part PDP may be greater than a width in the second direction DR2 of the line part LP.

The signal pad DP-PD may be disposed on the substrate SUB. The signal pad DP-PD may be disposed on the pad part PDP. Among the signal pads DP-PD, the first pad PD1 is shown as a representative example. The first pad PD1 may include a first electrode CL1 and a second electrode CL2. As an example, the first electrode CL1 and the second electrode CL2 may be the second connection electrode CNE2 of FIG. 5.

When viewed in the plane, the first and second electrodes CL1 and CL2 may overlap the pad part PDP. In an embodiment, the first and second electrodes CL1 and CL2 are shown as a representative example, however, one of the first and second electrodes CL1 and CL2 may be omitted, or additional electrode may be further disposed.

When viewed in the plane, a width in the first direction DR1 of the first electrode CL1 may be smaller than a width in the first direction DR1 of the second electrode CL2. When viewed in the plane, a width in the second direction DR2 of the first electrode CL1 may be smaller than a width in the second direction DR2 of the second electrode CL2. When viewed in the plane, widths in the first direction DR1 and the second direction DR2 of the pad part PDP may be respectively smaller than the widths in the first direction DR1 and the second direction DR2 of the first electrode CL1.

Referring to FIGS. 7 and 8, the display panel DP may include protruding portions OHP. The protruding portions OHP may be disposed in the first pad area PA1. Although not shown in figures, the protruding portions OHP may be disposed in the second pad area PA2.

When viewed in the plane, the protruding portions OHP may overlap the pad part PDP. The protruding portions OHP may partially overlap the pad part PDP.

In FIG. 8, eight protruding portions OHP are shown as a representative example, however, more protruding portions OHP may be arranged in the display panel DP.

Each of the protruding portions OHP may extend in the second direction DR2. When viewed in the plane, the protruding portions OHP may be disposed at opposite edges of the pad part PDP in the second direction DR2. When viewed in the plane, the protruding portions OHP arranged in an h-th column from a left side may overlap a left edge of the pad part PDP. The protruding portions OHP arranged in an (h+1)th column from the left side may overlap a right edge of the pad part PDP. The "h" may be a natural number. In the disclosure, the term 'column' may correspond to the first direction DR1.

The protruding portions OHP arranged in the h-th column may be arranged spaced apart from each other in the first direction DR1. The protruding portions OHP arranged in the (h+1)th column may be arranged spaced apart from each other in the first direction DR1. The protruding portions OHP arranged in the h-th column may be spaced apart from the protruding portions OHP arranged in the (h+1)th column in the second direction DR2. When viewed in the plane, the protruding portions OHP may be arranged in a zigzag shape. In detail, the protruding portions OHP arranged in the h-th column may be arranged staggered with respect to the protruding portions OHP arranged in the (h+1)th column. When viewed in the plane, the protruding portions OHP may be arranged inside the first electrode CL1 and the second electrode CL2.

Referring to FIGS. 7, 8, and 9A to 9C, comparison protruding portions COHP1, COHP2, and COHP3 shown in FIGS. 9A, 9B, and 9C may be arranged in the first direction DR1. When viewed in the plane, the comparison protruding portions COHP1, COHP2, and COHP3 may overlap a pad part PDP. When viewed in the plane, the comparison protruding portions COHP1, COHP2, and COHP3 may overlap a center of the pad part PDP.

A distance between first comparison protruding portions COHP1 spaced apart from each other in the first direction DR1 may be greater than a distance between second comparison protruding portions COHP2 spaced apart from each other and a distance between third comparison protruding portions COHP3 spaced apart from each other. The distance between the second comparison protruding portions COHP2 spaced apart from each other in the first direction DR1 may be greater than the distance between the third comparison protruding portions COHP3 spaced apart from each other in the first direction DR1. As the distance between the comparison protruding portions COHP1, COHP2, and COHP3 spaced apart from each other in the first direction decreases, the number of the comparison protruding portions COHP1, COHP2, and COHP3 overlapping the pad part PDP may increase.

The driver DC may be attached to the signal pads DP-PD by the first adhesive layer CF1 of FIG. 7. Although not shown in figures, the first adhesive layer CF1 that is not solidified may be disposed between the driver DC and the signal pads DP-PD. In case that the first adhesive layer CF1 is provided, an external pressure may be applied to the driver DC and the signal pads DP-PD. In case that the external pressure is applied, a portion of the first adhesive layer CF1, which has a fluidity, may flow outward, and a residual first adhesive layer CF1 may be cured to fix the driver DC to the signal pads DP-PD. In cases where the comparison protruding portions COHP1, COHP2, and COHP3 are not arranged in the staggered manner as shown in FIGS. 9A to 9C, the comparison protruding portions COHP1, COHP2, and COHP3 may obstruct the flow of the first adhesive layer CF1. Accordingly, the first adhesive layer CF1 may remain more than necessary between the driver DC and the signal pads DP-PD, and the electrical connection between the driver DC and the signal pads DP-PD may be disrupted. As a result, defects may occur in the display panel DP.

However, according to the disclosure, the protruding portions OHP arranged in the first direction DR1 may be arranged spaced apart from each other, and the protruding portions OHP arranged in the h-th column may be arranged staggered with respect to the protruding portions OHP arranged in the (h+1)th column. Accordingly, the first adhesive layer CF1 may flow outward without being disrupted by the protruding portions OHP. Therefore, defects caused by the residual first adhesive layer CF1 may be reduced.

A flow rate of the first adhesive layer CF1 with the fluidity may increase.

TABLE 1

| 15 MPa (bonding pressure) | FIG. 8 | FIG. 9A | FIG. 9B | FIG. 9C |
|---|---|---|---|---|
| Time (Sec) | 0.75 | 0.78 | 0.8 | 0.83 |

Table 1 shows results of an experimental example conducted to determine how long it takes for the driver DC and the signal pads DP_PD to make contact with each other according to the arrangement of the comparison protruding portions COHP1, COHP2, and COHP3 and the protruding portions OHP. As an example, the driver DC and the signal pads DP-PD may be pressurized with the same pressure of about 15Ma.

Referring to Table 1, in case that the protruding portions OHP are arranged in the zigzag shape as shown in FIG. 8, the outward flow rate of the first adhesive layer CF1 may become the fastest, and the time it takes for the driver DC to make contact with the signal pads DP-PD may be about 0.75 seconds. As shown in FIGS. 9A to 9C, in case that the comparison protruding portions COHP1, COHP2, and COHP3 are arranged in a straight line shape, the flow rate of the first adhesive layer CF1 may become slow. In detail, as the distance between the comparison protruding portions COHP1, COHP2, and COHP3 decreases, the flow rate may become slow, and thus, the time it takes for the driver DC to make contact with the signal pads DP_PD may increase. According to the disclosure, as the protruding portions OHP are arranged in a staggered manner, the flow rate of the first adhesive layer CF1 may increase, and the time it takes for the driver DC to make contact with the signal pads DP_PD by the pressure process may decrease.

Referring to FIG. 8, when viewed in the plane, contact holes COP may be defined through the first electrode CL1 and the second electrode CL2. The contact holes COP may be arranged in the first direction DR1. When viewed in the plane, the contact holes COP may overlap the pad part PDP. When viewed in the plane, the contact holes COP may not overlap the protruding portions OHP. The contact holes COP will be described in detail with reference to FIG. 10C.

Figure 10A:
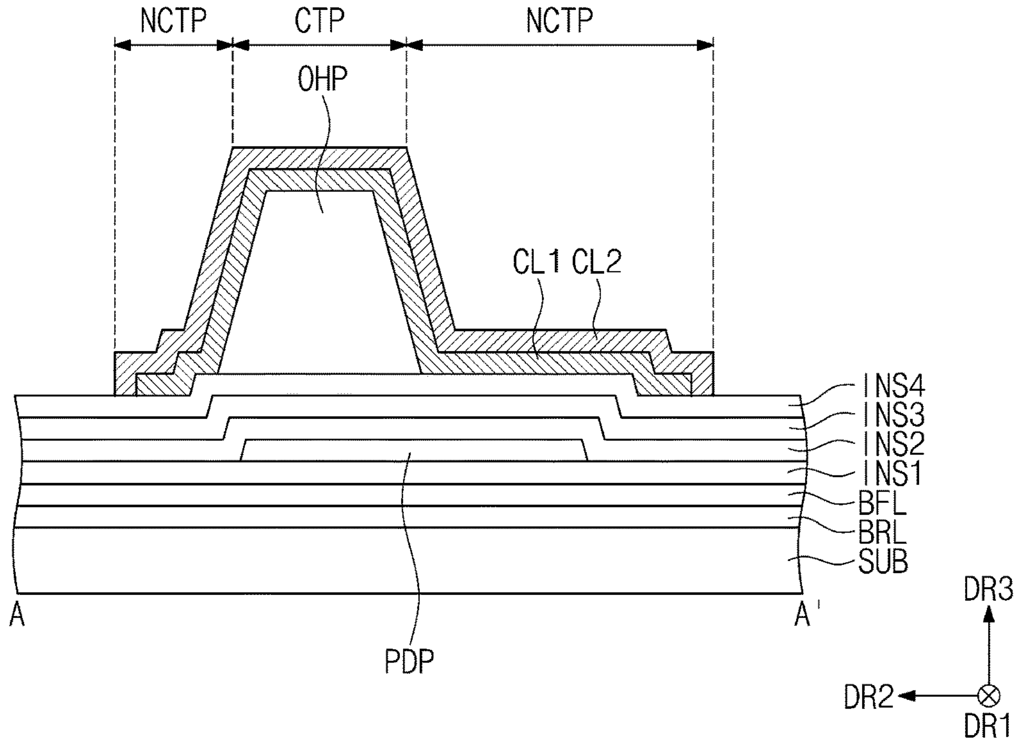
FIGS. 10A to 10C are schematic cross-sectional views of signal pads and signal lines shown in FIG. 8.
Figure 10B:
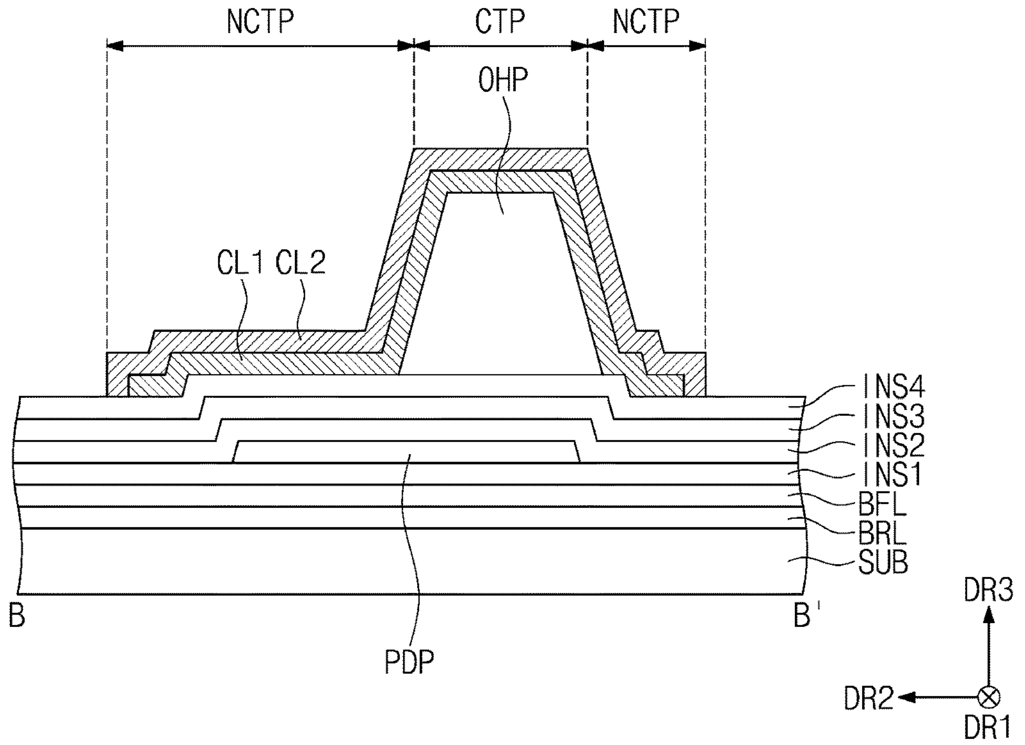
Figure 10C:
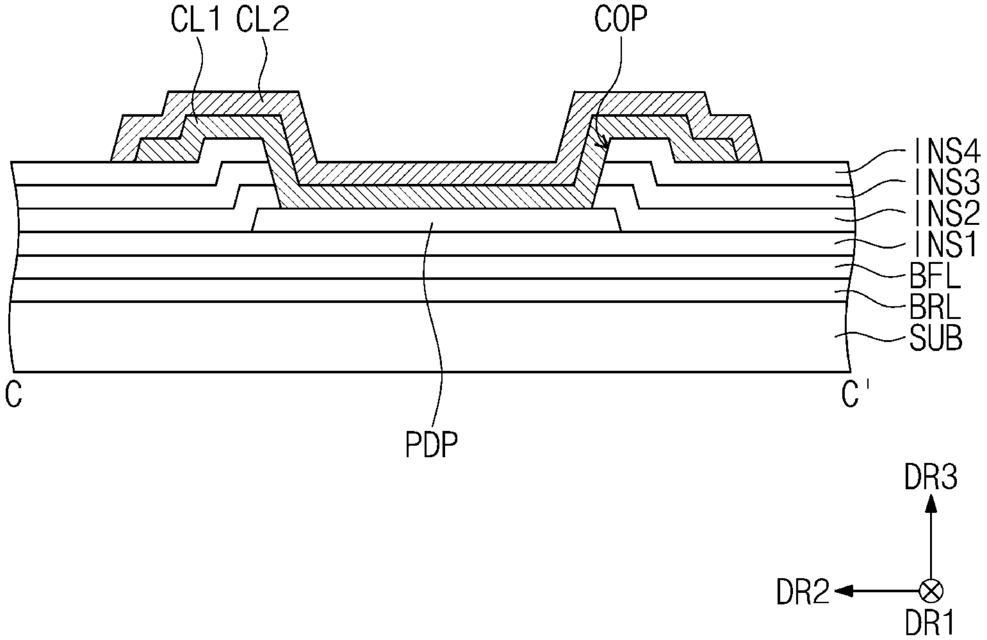

FIGS. 10A to 10C are schematic cross-sectional views of the signal pads and the signal lines shown in FIG. 8.

FIG. 10A is a schematic cross-sectional view taken along line A-A' of FIG. 8. FIG. 10B is a schematic cross-sectional view taken along line B-B' of FIG. 8. FIG. 10C is a schematic cross-sectional view taken along line C-C' of FIG. 8.

A substrate SUB, a barrier layer BRL, a buffer layer BFL, a first insulating layer INS1, a second insulating layer INS2, a third insulating layer INS3, and a fourth insulating layer INS4 of FIGS. 10A to 10C are substantially the same as the substrate SUB, the barrier layer BRL, the buffer layer BFL, the first insulating layer INS1, the second insulating layer INS2, the third insulating layer INS3, and the fourth insulating layer INS4 of FIG. 5, and thus, details thereof will be omitted or briefly described.

Referring to FIGS. 10A and 10B, the pad part PDP may be disposed on the buffer layer BFL. The pad part PDP may be the data line DL of FIG. 4. The second insulating layer INS2 may be disposed on the first insulating layer INS1 to cover the pad part PDP. The third insulating layer INS3 may be disposed on the second insulating layer INS2. The fourth insulating layer INS4 may be disposed on the third insulating layer INS3.

The protruding portion OHP may be disposed on the fourth insulating layer INS4. The protruding portion OHP may partially overlap the pad part PDP. As an example, the protruding portion OHP may be disposed adjacent to the left edge of the pad part PDP and may overlap the left edge of the pad part PDP as shown in FIG. 10A. The protruding portion OHP may be disposed adjacent to the right edge of the pad part PDP and may overlap the right edge of the pad part PDP as shown in FIG. 10B.

When viewed in the first direction DR1, the protruding portion OHP may have a trapezoid shape, however, the shape of the protruding portion OHP should not be limited to the trapezoid shape. The protruding portion OHP may have a variety of shapes.

The protruding portion OHP may include a polymer. The protruding portion OHP may include an organic insulating layer. The protruding portion OHP may include a thermosetting polymer, however, it should not be limited thereto or thereby. According to an embodiment, the protruding portion OHP may include a thermoplastic polymer. As an example, the protruding portion OHP may be formed through the same process as the pixel definition layer PDL of FIG. 5.

The first electrode CL1 may be disposed on the fourth insulating layer INS4 and the protruding portion OHP. The first electrode CL1 may cover the protruding portion OHP. The second electrode CL2 may be disposed on the first electrode CL1. The second electrode CL2 may be disposed on the protruding portion OHP. The second electrode CL2 may cover the first electrode CL1. The first and second electrodes CL1 and CL2 may cover the protruding portion OHP. The first and second electrodes CL1 and CL2 may be electrically connected to each other. As an example, the first and second electrodes CL1 and CL2 may be the second connection electrode CNE2 of FIG. 5.

A portion of the first and second electrodes CL1 and CL2, which overlaps the protruding portion OHP, may be defined as a contact portion CTP. The contact portion CTP may be disposed at an upper end of the protruding portion OHP. A portion of the first and second electrodes CL1 and CL2, which does not overlap the protruding portion OHP, may be defined as a non-contact portion NCTP. The non-contact portion NCTP may be disposed around the contact portion CTP. The contact portion CTP may protrude in the third direction DR3 compared with the non-contact portion NCTP. The non-contact portion NCTP may be placed at a lower position than that of the contact portion CTP.

Referring to FIG. 10C, the contact hole COP may be defined through the second to fourth insulating layers INS2 to INS4. The pad part PDP may be exposed outwardly through the contact hole COP. The first electrode CL1 may be disposed on the fourth insulating layer INS4. The first electrode CL1 may be disposed on the contact hole COP. The first electrode CL1 may be in contact with the pad part PDP exposed to the outside. The first electrode CL1 and the pad part PDP may be electrically connected to each other. The second electrode CL2 may be disposed on the first electrode CL1. The second electrode CL2 may be disposed in the contact hole COP. The second electrode CL2 may be in contact with and electrically connected to the first electrode CL1. The second electrode CL2 may be connected to the pad part PDP via the first electrode CL1.

Figure 11:
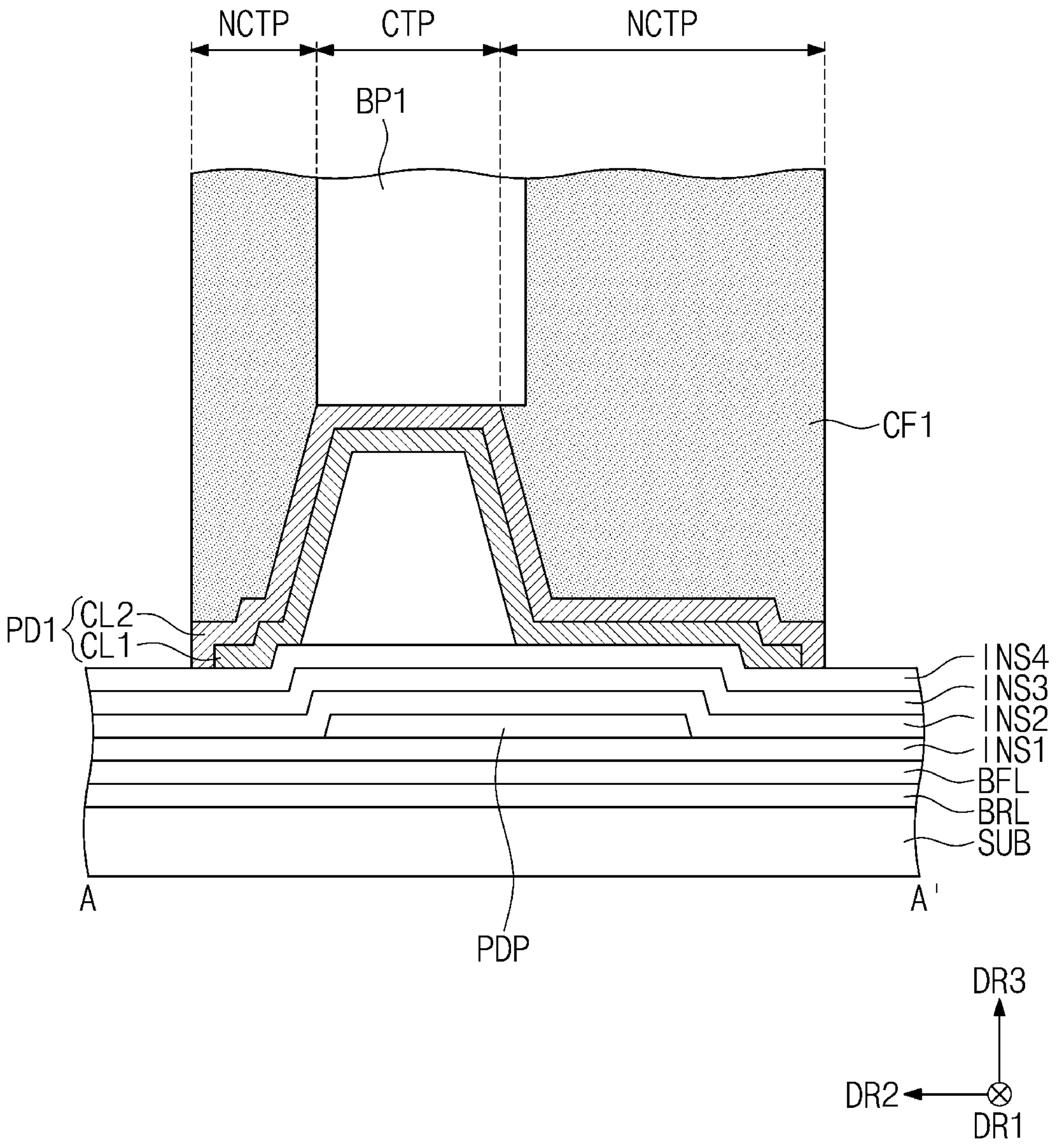
FIG. 11 is a view illustrating a contact between a first pad and a first bump.

FIG. 11 is a view illustrating a contact between the first pad PD1 and the first bump BP1.

FIG. 11 is a schematic cross-sectional view of the first pad PD1 and the first bump BP1 when viewed in the first direction DR1.

FIG. 11 shows the first pad PD1 and the first bump BP1 as a representative example, however, the second pad PD2 and the third pad PD3 may be respectively in contact with the second bump BP2 and the third bump BP3 in FIG. 7 through the same structure as that of the first pad PD1 and the first bump BP1.

The pad part PDP, the first pad PD1, and the first bump BP1 of FIG. 11 are substantially the same as the pad part PDP and the first pad PD1 of FIG. 10A to 10C and the first bump BP1 of FIG. 7, and thus, details thereof will be omitted or briefly described.

Referring to FIGS. 7, 10A to 10C, and 11, the first bump BP1 may be connected to the first pad PD1.

The first electrode CL1 and the second electrode CL2 may protrude from the fourth insulating layer INS4 by the protruding portion OHP. As the first pad PD1 protrudes, the first pad PD1 may be in contact with the first bump BP1 without conductive balls.

The first bump BP1 may be in contact with the contact portion CTP of the first pad PD1. The first bump BP1 may be in contact with the second electrode CL2. The first bump BP1 may be connected to the first electrode CL1 and the pad part PDP via the second electrode CL2.

During the process of contacting the first bump BP1 with the contact portion CTP, the first bump BP1 may be spaced apart from the contact portion CTP in the second direction DR2 due to external factors. In case that the contact portion CTP of the first pad PD1 overlaps a center of the pad part PDP, the contact portion CTP may not be in contact with the first bump BP1. As a result, defects may occur.

However, the contact portion CTP according to the disclosure may be spaced apart from the center of the pad part PDP and may overlap an edge of the pad part PDP. Accordingly, even though the first bump BP1 is spaced apart from the contact portion CTP in the second direction DR2, an acceptable margin error may be reduced, and the first bump BP1 may be connected to the contact portion CTP. Accordingly, defects may be reduced.

FIGS. 12A to 12D are views of protruding portions OHPa, OHPb, OHPc, and OHPd according to embodiments.

FIGS. 12A to 12D are schematic plan views of the protruding portions OHPa, OHPb, OHPc, and OHPd.

A substrate SUB, a line part LP, a pad part PDP, a first electrode CL1, a second electrode CL2, and a contact holes COP of FIGS. 12A to 12D are substantially the same as the substrate SUB, the line part LP, the pad part PDP, the first electrode CL1, the second electrode CL2, and the contact holes COP of FIGS. 8 and 10A to 10C, and thus, details thereof will be omitted or briefly described.

The protruding portions OHPa, OHPb, OHPc, and OHPd of FIGS. 12A to 12D are substantially the same as the protruding portions OHP of FIGS. 10A to 10C except directions in which the protruding portions OHPa, OHPb, OHPc, and OHPd extend, and thus, descriptions will be focused on features different from the protruding portions OHP.

As an example, a first diagonal direction DDR1 may be a direction that intersects the first and second directions DR1 and DR2 on the plane defined by the first direction DR1 and the second direction DR2. A second diagonal direction DDR2 may be a direction that intersects the first diagonal direction DDR1.

Figure 12A:
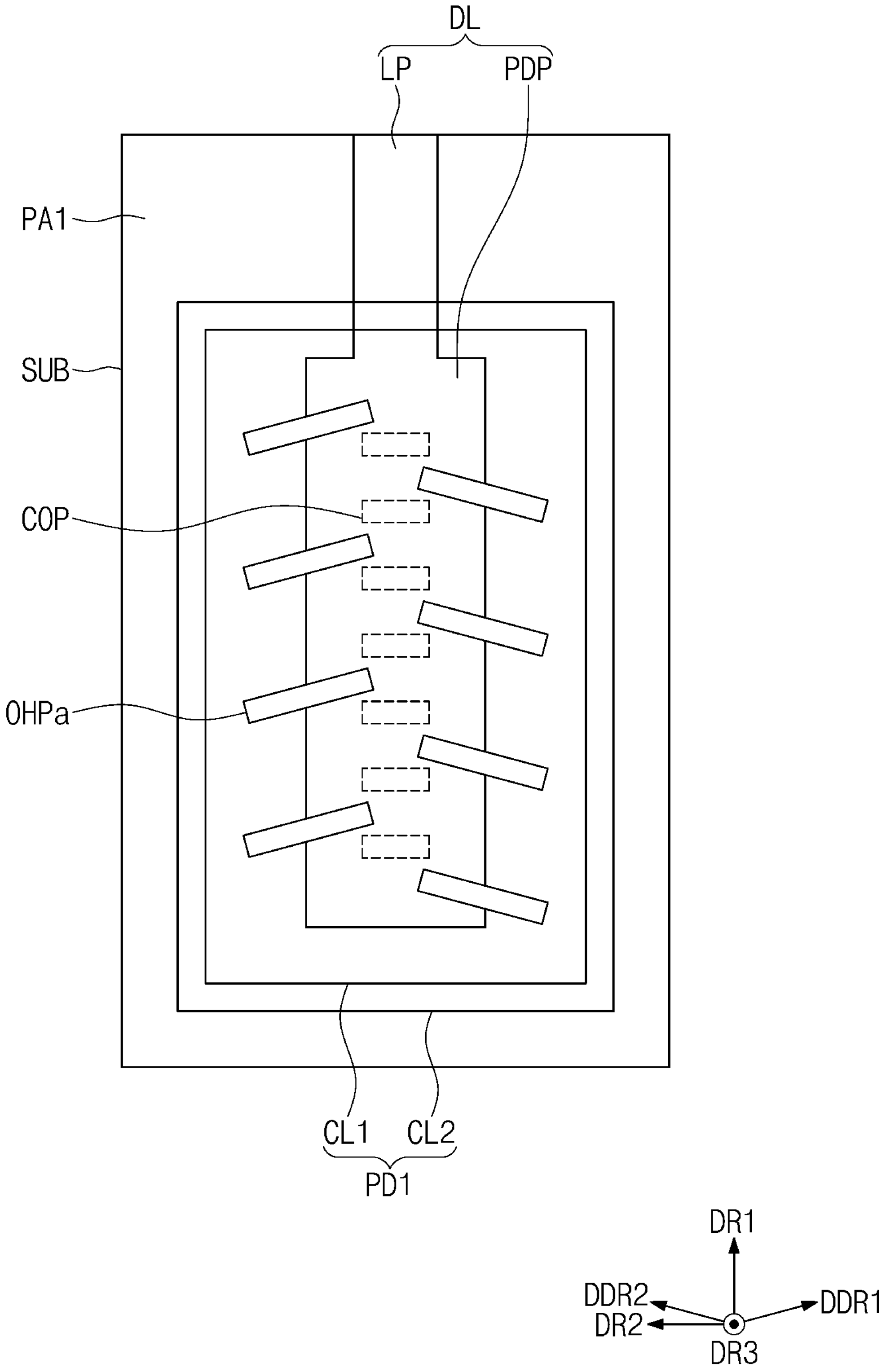
FIGS. 12A to 12D are views of protruding portions according to embodiments.

Referring to FIG. 12A, when viewed in a plane, the protruding portions OHPa arranged in an h-th column from a left side may extend in the first diagonal direction DDR1. The protruding portions OHPa arranged in an (h+1)th column from the left side may extend in the second diagonal direction DDR2. The “h” may be a natural number.

Figure 12B:
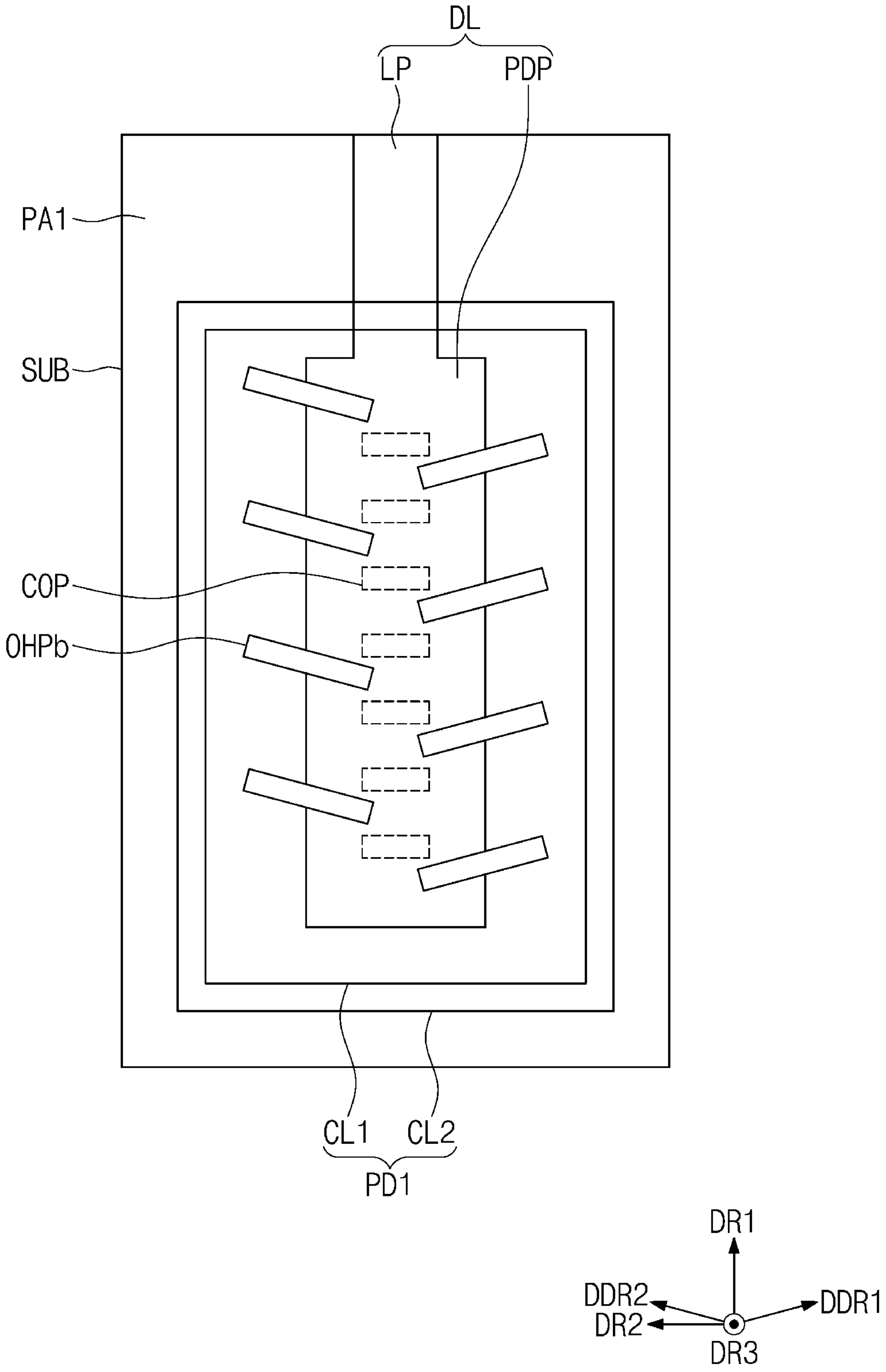

Referring to FIG. 12B, when viewed in a plane, the protruding portions OHPb arranged in an h-th column from a left side may extend in the second diagonal direction DDR2. The protruding portions OHPb arranged in an (h+1)th column from the left side may extend in the first diagonal direction DDR1. The “h” may be a natural number.

Figure 12C:
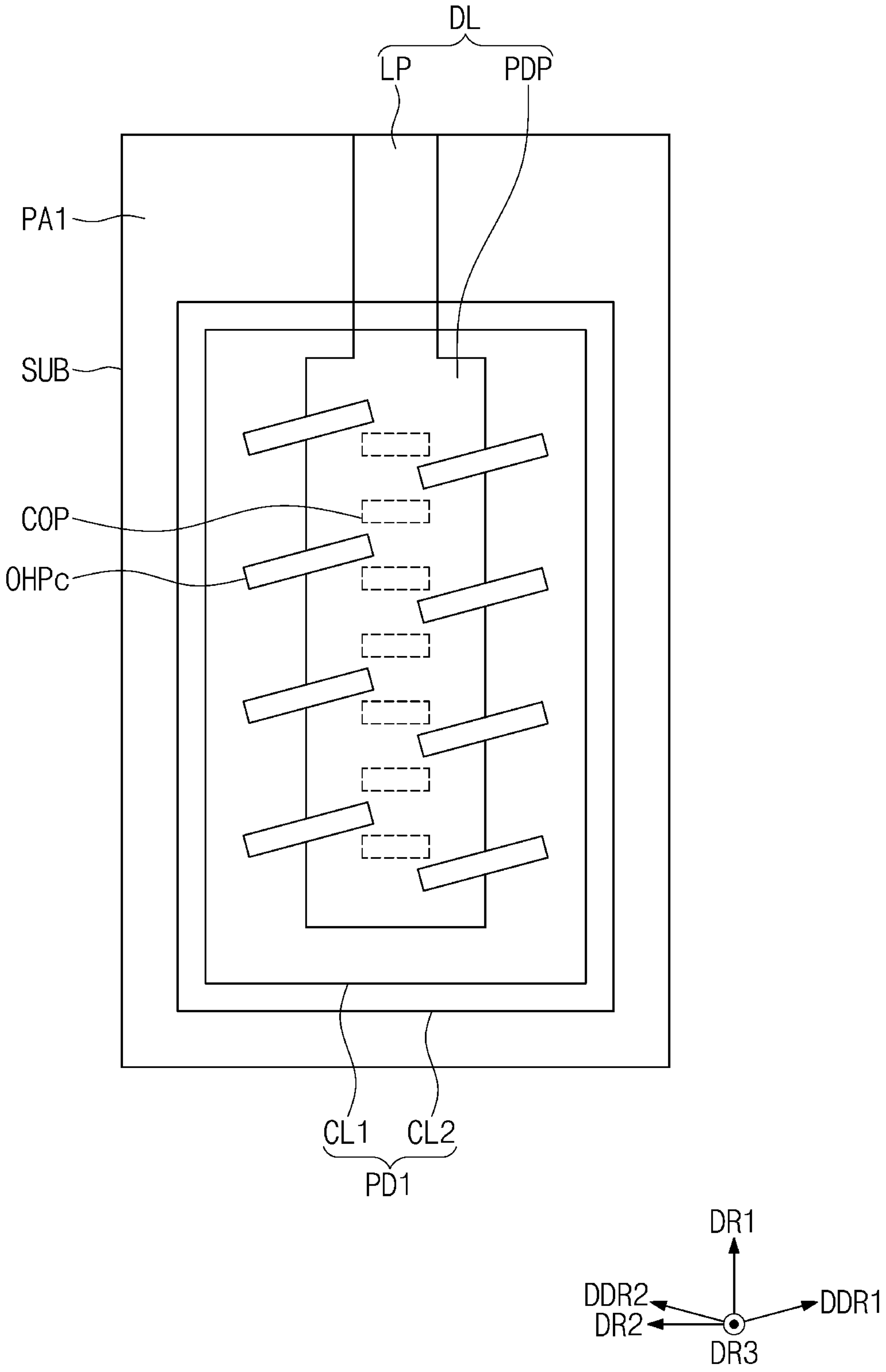

Referring to FIG. 12C, when viewed in a plane, the protruding portions OHPc arranged in an h-th column from a left side and the protruding portions OHPc arranged in an (h+1)th column from the left side may extend in the first diagonal direction DDR1. The “h” may be a natural number.

Figure 12D:
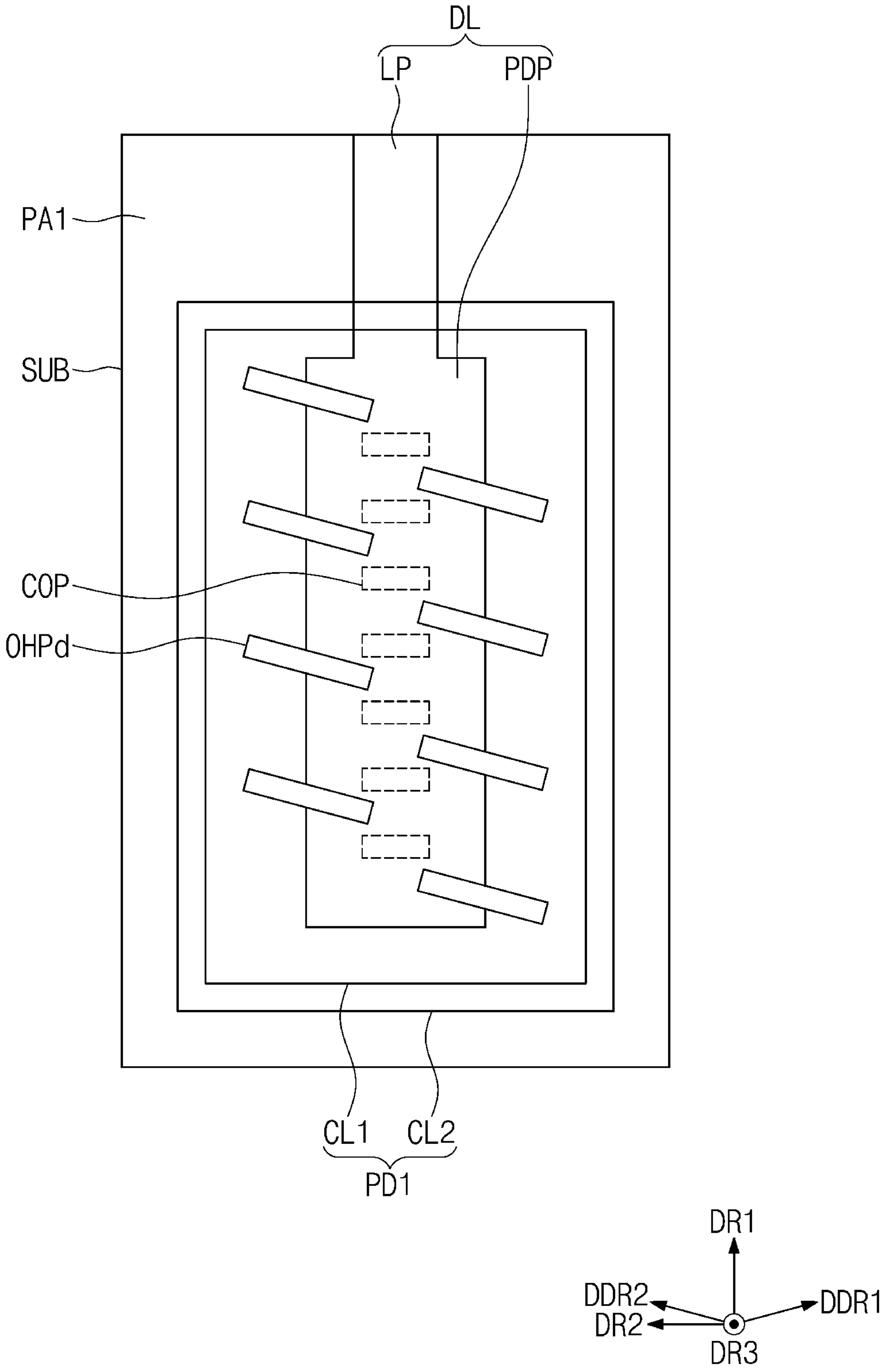

Referring to FIG. 12D, when viewed in a plane, the protruding portions OHPd arranged in an h-th column from a left side and the protruding portions OHPd arranged in an (h+1)th column from the left side may extend in the second diagonal direction DDR2. The “h” may be a natural number.

Figure 13A:
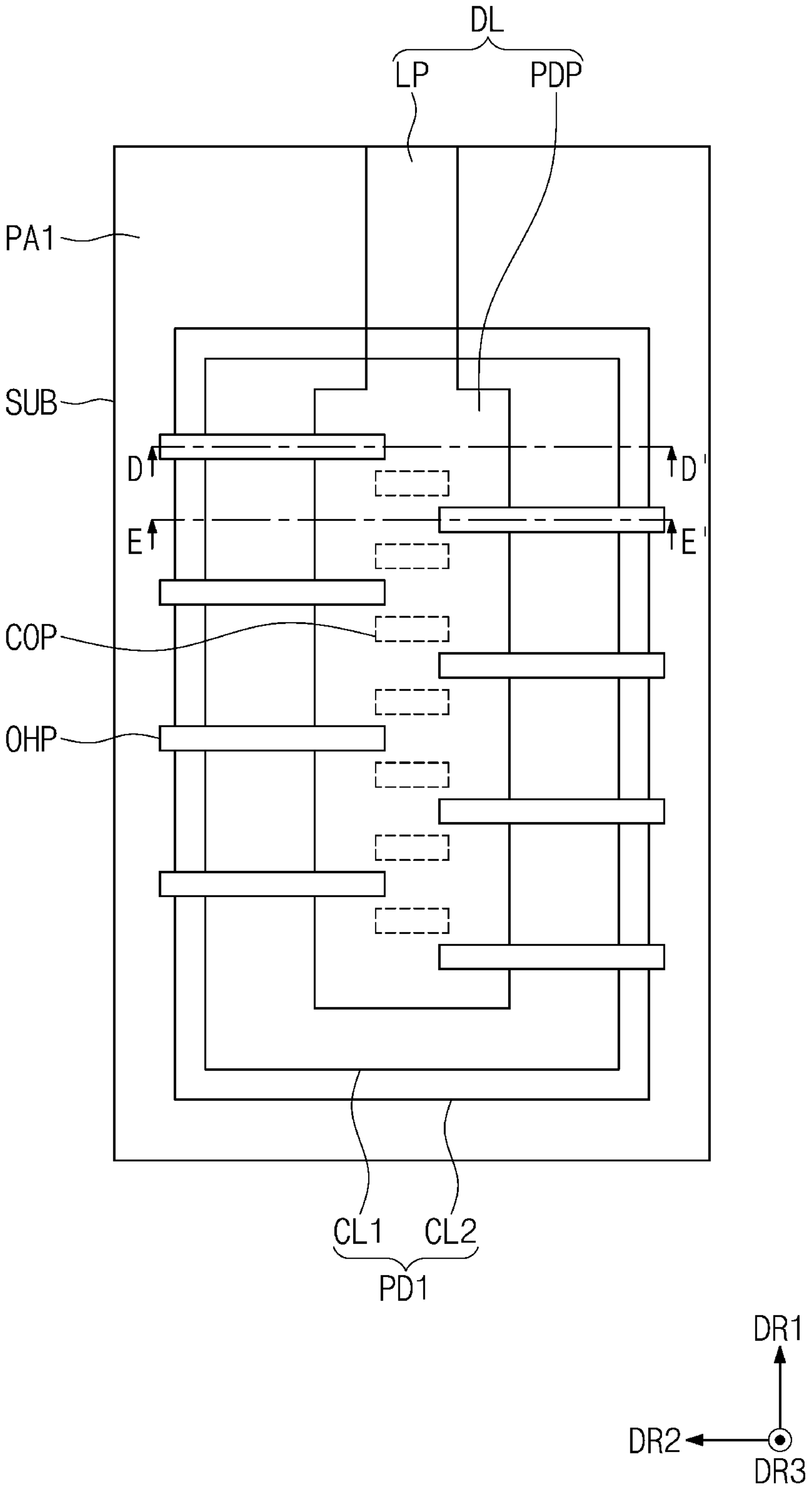
FIGS. 13A to 13C are views of signal pads and signal lines according to an embodiment.
Figure 13B:
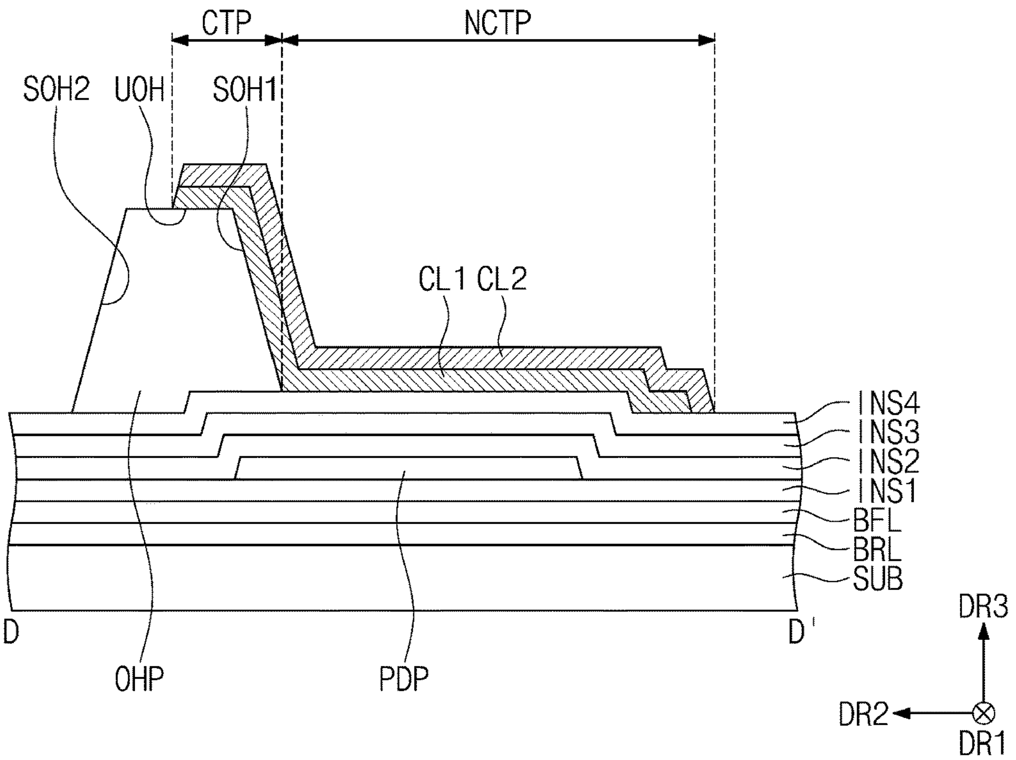
Figure 13C:
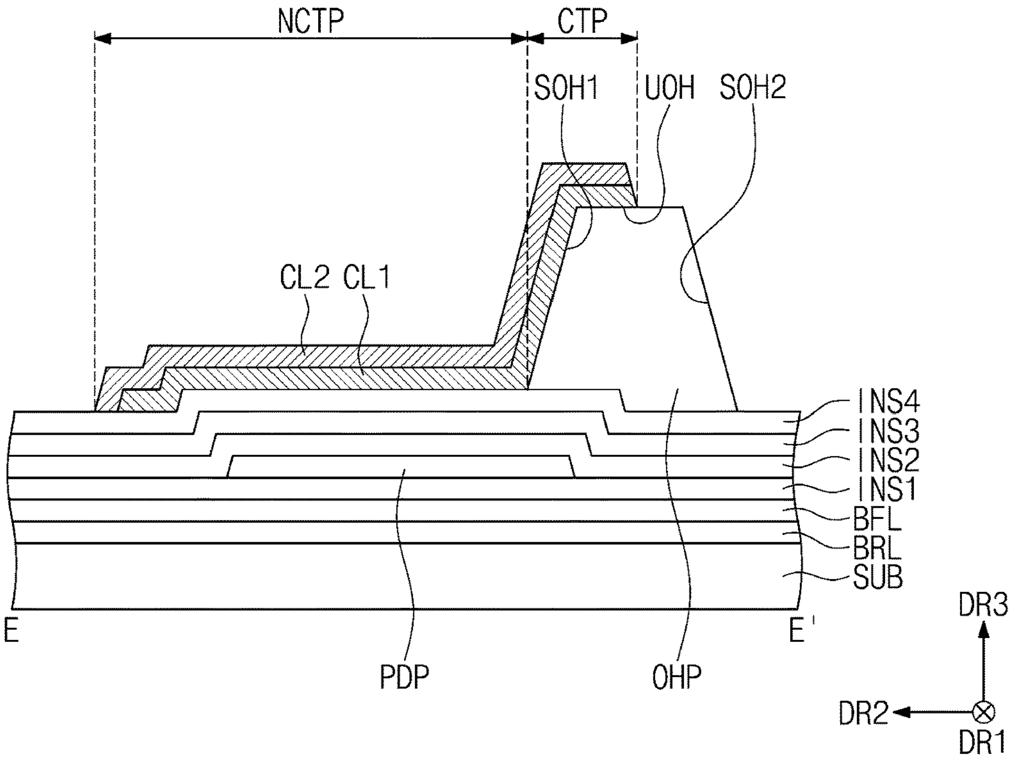

FIGS. 13A to 13C are views of signal pads and signal lines according to an embodiment.

FIG. 13A is a schematic plan view, FIG. 13B is a schematic cross-sectional view taken along line D-D' of FIG. 13A, and FIG. 13C is a schematic cross-sectional view taken along line E-E' of FIG. 13A.

FIGS. 13A to 13C show a first pad PD1 as a representative example, however, the second pad PD2 and the third pad PD3 of FIG. 7 may have substantially the same structure as that of the first pad PD1.

A substrate SUB, a line part LP, a pad part PDP, first to fourth insulating layers INS1 to INS4, a first electrode CL1, a second electrode CL2, and contact holes COP of FIGS. 13A to 13C are substantially the same as the substrate SUB, the line part LP, the pad part PDP, the first to fourth insulating layer INS1 to INS4, the first electrode CL1, the second electrode CL2, and the contact holes COP of FIGS. 8 and 10A to 10C, and thus, details thereof will be omitted or briefly described.

Referring to FIG. 13A, when viewed in a plane, protruding portions OHP may extend in the second direction DR2. When viewed in the plane, one of the sides of opposite sides of the protruding portions OHP in the second direction DR2 may be placed outside the second electrode CL2. The one of the sides of the protruding portions OHP may be opposite to the other sides of the protruding portions OHP, which overlap the pad part PDP.

Referring to FIGS. 13A to 13C, the protruding portion OHP may be disposed on the fourth insulating layer INS4. The protruding portion OHP may be disposed to partially overlap an edge of the pad part PDP. In detail, the protruding portion OHP of FIG. 13B may overlap a left edge of the pad part PDP, and the protruding portion OHP of FIG. 13C may overlap a right edge of the pad part PDP.

The protruding portions OHP arranged in an h-th column from a left side and the protruding portions OHP arranged in an (h+1)th column from the left side may be spaced apart from each other in the second direction DR2. When viewed in the plane, the protruding portions OHP may be arranged in a zigzag shape. In detail, the protruding portions OHP arranged in the h-th column and the protruding portions OHP arranged in the (h+1)th column may be arranged staggered with respect to each other. The “h” may be a natural number.

The first electrode CL1 may be disposed on the fourth insulating layer INS4 and the protruding portion OHP. The first electrode CL1 may cover one side or a side surface SOH1 of opposite side surfaces of the protruding portion OHP in the second direction DR2 and a portion of an upper surface UOH. The one side surface or a side surface SOH1 of the protruding portion OHP may be defined as a side surface adjacent to the pad part PDP. The second electrode CL2 may be disposed on the first electrode CL1. The second electrode CL2 may overlap the one side surface or a side surface SOH1 of the protruding portion OHP and the portion of the upper surface UOH. The other side surface SOH2 of the protruding portion OHP may be exposed to the outside of the first electrode CL1 and the second electrode CL2.

Although not shown in figures, the first electrode CL1 and the second electrode CL2 may be in contact with the pad part PDP via the contact hole COP defined through the second to fourth insulating layers INS2 to INS4. Detailed descriptions of the first electrode CL1 and the second electrode CL2 are substantially the same as those of FIG. 10C, and thus, details thereof will be omitted.

A portion of the first and second electrodes CL1 and CL2, which overlaps the protruding portion OHP, may be defined as a contact portion CTP, and a portion of the first and second electrodes CL1 and CL2, which does not overlap the protruding portion OHP, may be defined as a non-contact portion NCTP.

Although not shown in figures, the contact portion CTP may be in contact with the first bump BP1 of FIG. 11. The second electrode CL2 may be in contact with the first bump BP1. The contact between the contact portion CTP and the first bump BP1 is as described with reference to FIG. 11 and thus will not be repeated here. As the contact portion CTP is in contact with the first bump BP1, the pad part PDP may be connected to the driver DC of FIG. 5.

FIGS. 14A to 14D are views of protruding portions according to embodiments.

FIGS. 14A to 14D are schematic plan views of the protruding portions.

FIGS. 14A to 14D show a first pad PD1 as a representative example, however, the second pad PD2 and the third pad PD3 (refer to FIG. 7) may have substantially the same structure as that of the first pad PD1.

A substrate SUB, a line part LP, a pad part PDP, a first electrode CL1, a second electrode CL2, and a contact hole COP of FIGS. 14A to 14D are substantially the same as the substrate SUB, the line part LP, the pad part PDP, the first electrode CL1, the second electrode CL2, and the contact hole COP, and thus, details thereof will be omitted or briefly described.

Since the protruding portions OHPe, OHPf, OHPg, and OHPh of FIGS. 14A to 14D are substantially the same as the protruding portions OHP of FIGS. 13A to 13C except directions in which the protruding portions OHPe, OHPf, OHPg, and OHPh extend, descriptions will be focused on features different from the protruding portions OHP.

Hereinafter, the first diagonal direction DDR1 may be a direction that intersects the first and second directions DR1 and DR2 on the plane defined by the first direction DR1 and the second direction DR2. The second diagonal direction DDR2 may be a direction that intersects the first diagonal direction DDR1.

Figure 14A:
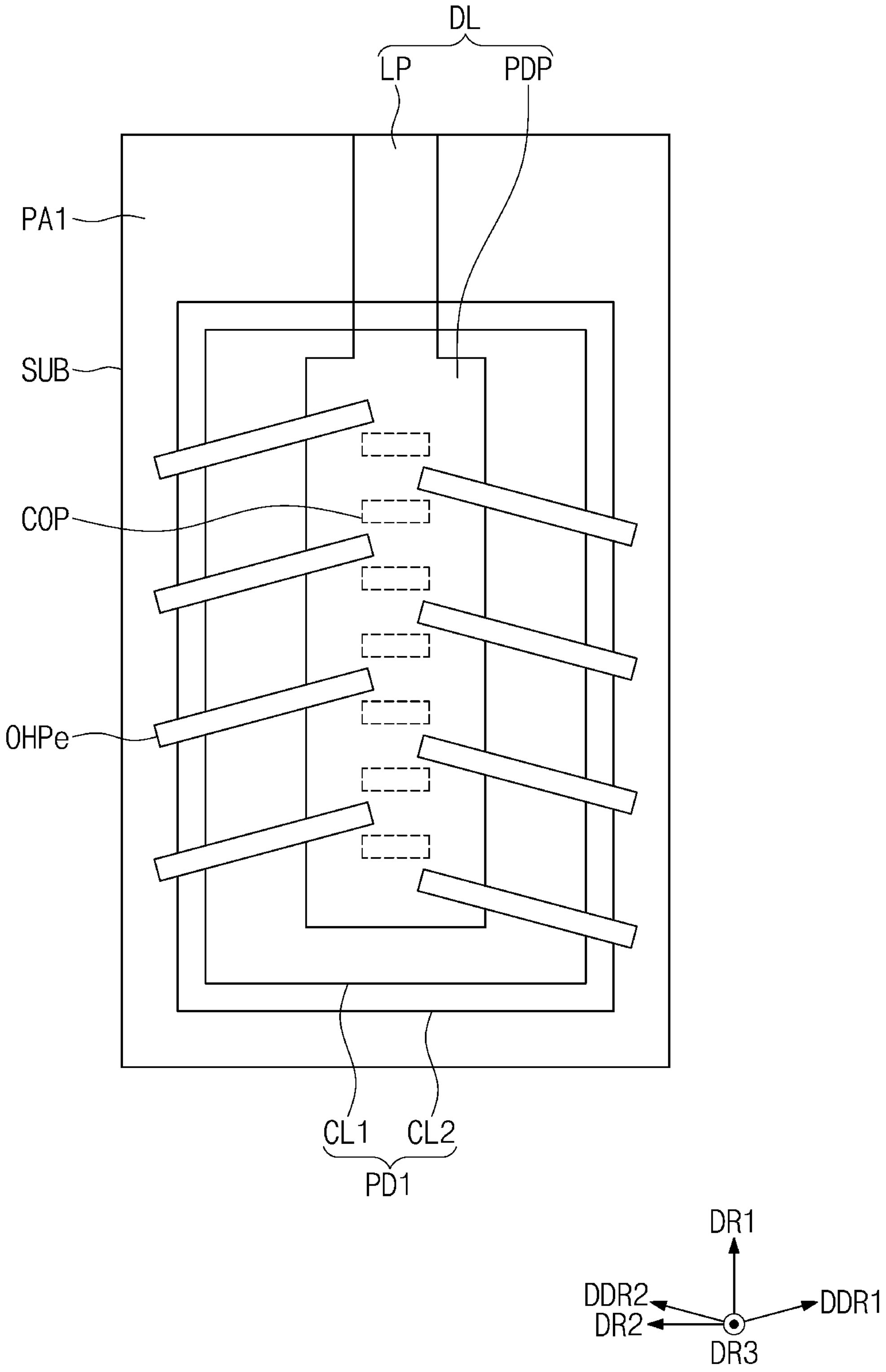
FIGS. 14A to 14D are views of protruding portions according to embodiments.

Referring to FIG. 14A, when viewed in the plane, the protruding portions OHPe arranged in an h-th column from a left side may extend in the first diagonal direction DDR1. The protruding portions OHPe arranged in an (h+1)th column from the left side may extend in the second diagonal direction DDR2. The "h" may be a natural number. When viewed in the plane, the protruding portions OHPe may extend to the outside of the first and second electrodes CL1 and CL2.

Figure 14B:
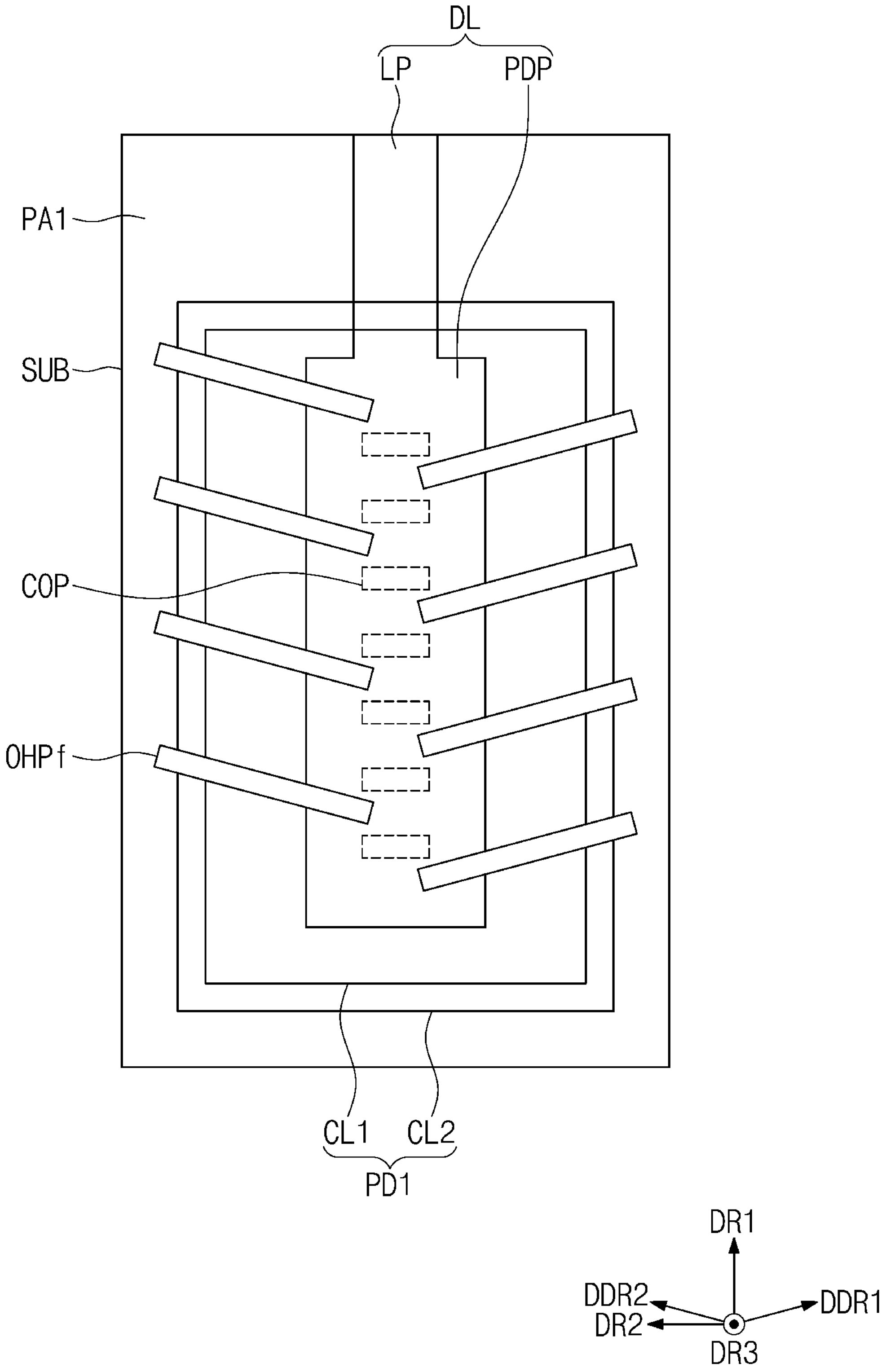

Referring to FIG. 14B, when viewed in the plane, the protruding portions OHPf arranged in an h-th column from a left side may extend in the second diagonal direction DDR2. The protruding portions OHPf arranged in an (h+1) th column from the left side may extend in the first diagonal direction DDR1. The "h" may be a natural number. When viewed in the plane, the protruding portions OHPf may extend to the outside of the first and second electrodes CL1 and CL2.

Figure 14C:
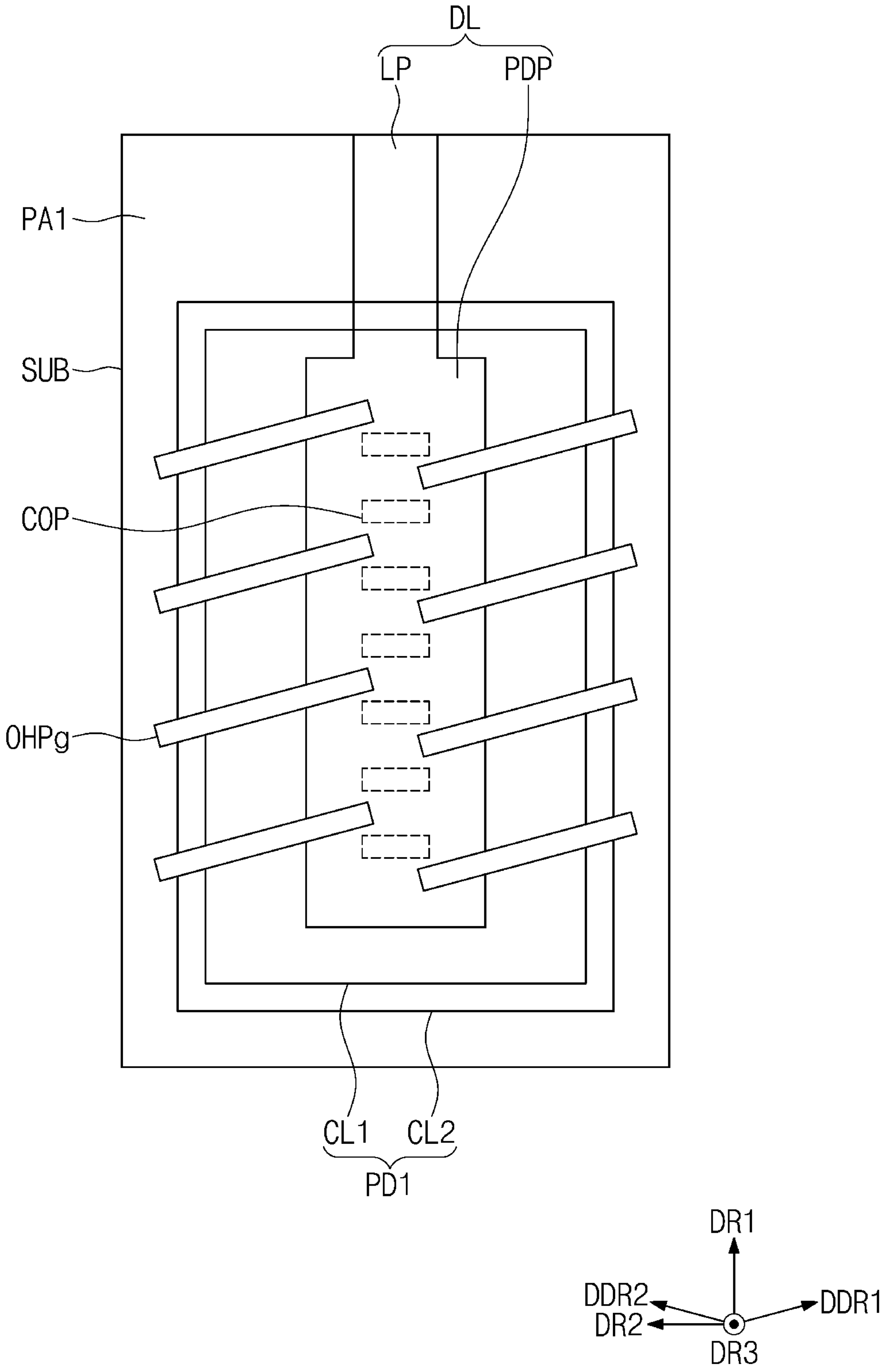

Referring to FIG. 14C, when viewed in the plane, the protruding portions OHPg arranged in an h-th column from a left side and the protruding portions OHPg arranged in an (h+1)th column from the left side may extend in the first diagonal direction DDR1. The protruding portions OHPg arranged in the h-th column and the protruding portions OHPg arranged in the (h+1)th column may extend in the same direction. When viewed in the plane, the protruding portions OHPg may extend to the outside of the first and second electrodes CL1 and CL2. The "h" may be a natural number.

Figure 14D:
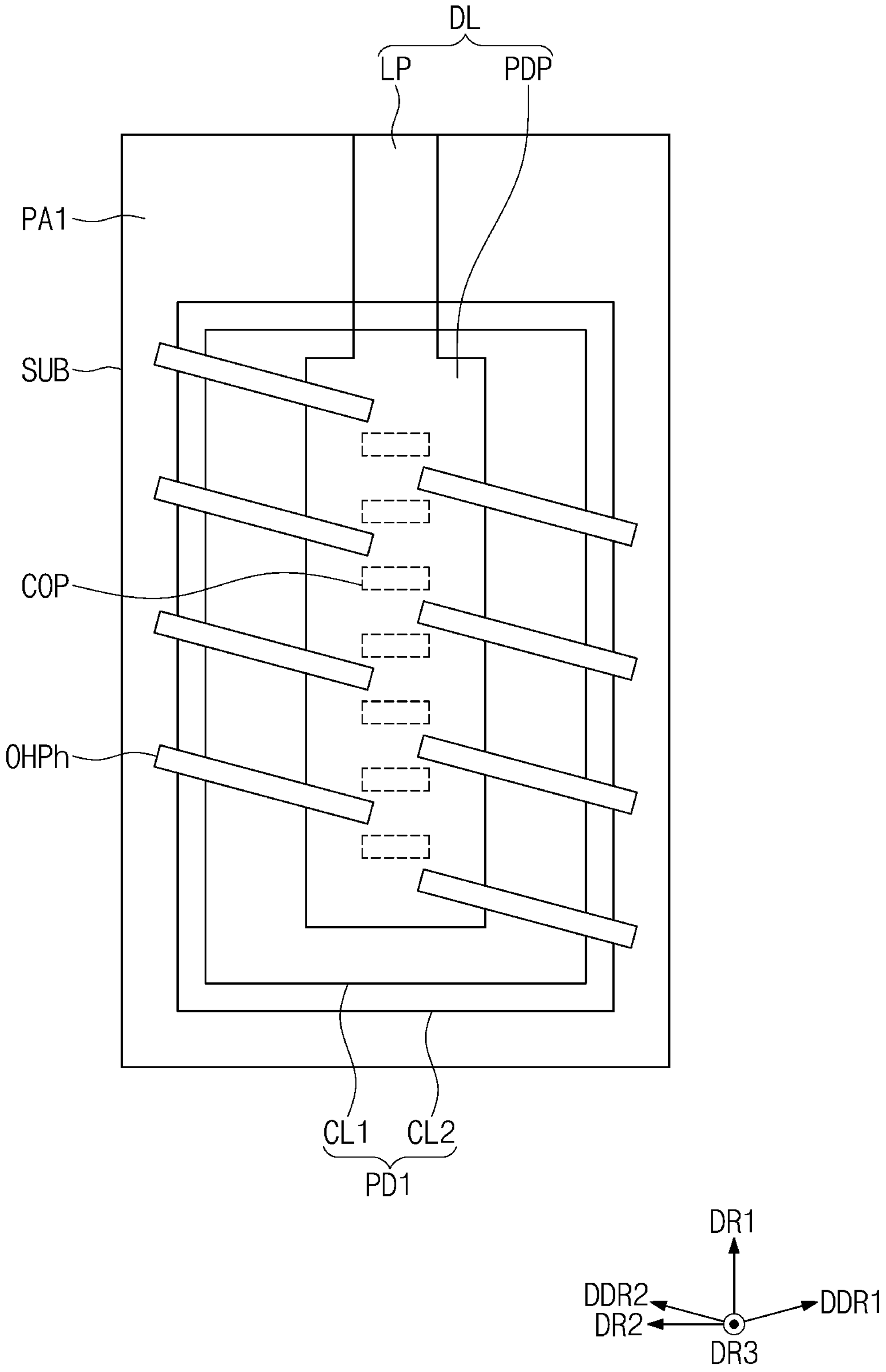

Referring to FIG. 14D, when viewed in the plane, the protruding portions OHPh arranged in an h-th column from a left side and the protruding portions OHPh arranged in an (h+1)th column from the left side may extend in the second diagonal direction DDR2. The protruding portions OHPh arranged in the h-th column and the protruding portions OHPh arranged in the (h+1)th column may extend in the same direction. When viewed in the plane, the protruding portions OHPh may extend to the outside of the first and second electrodes CL1 and CL2. The "h" may be a natural number.

Although embodiments have been described, it is understood that the disclosure should not be limited to these embodiments but various changes and modifications can be made by one of ordinary skill in the art within the spirit and scope of the disclosure and as hereinafter claimed. Therefore, the disclosed subject matter should not be limited to any single embodiment described herein, and the scope of the disclosure shall also be determined according to the attached claims.

What is claimed is:

1. A display device comprising:
a substrate;
a pixel disposed on the substrate;
a signal line comprising a line part electrically connected to the pixel and a pad part extending from an end of the line part and having a width greater than a width of the line part;
a signal pad disposed on the pad part; and
protruding portions disposed between the signal pad and the pad part and protruding upward,
wherein the protruding portions are spaced apart from each other and disposed in a substantially zigzag shape.

2. The display device of claim 1, wherein the protruding portions overlap the signal pad, and the signal pad covers the protruding portions in a plan view.

3. The display device of claim 2, wherein the protruding portions partially overlap the pad part in a plan view.

4. The display device of claim 1, further comprising:
an insulating layer disposed between the signal pad and the pad part,
wherein the signal pad is electrically connected to the pad part by at least one contact hole defined through the insulating layer.

5. The display device of claim 4, wherein the insulating layer is further disposed between the protruding portions and the pad part.

6. The display device of claim 4, wherein the protruding portions do not overlap the contact hole in a plan view.

7. The display device of claim 1, further comprising:
a driver electrically connected to the signal pad, wherein the signal pad comprises:
contact portions disposed on upper ends of the protruding portions; and
a non-contact portion disposed around the contact portions and placed at a lower position than a position of the contact portions, and
the driver electrically contacts the contact portions.

8. The display device of claim 7, wherein the driver comprises:
bump electrodes disposed on the contact portions and electrically contacting the contact portions; and
an integrated circuit chip disposed on the bump electrodes and electrically connected to the bump electrodes.

9. The display device of claim 1, wherein
the signal line extends in a first direction, the first direction corresponds to a column direction,
the protruding portions disposed in an h-th column are spaced apart from the protruding portions disposed in an (h+1)th column in a second direction intersecting the first direction,
the protruding portions disposed in the h-th column are arranged staggered with respect to the protruding portions disposed in the (h+1)th column, and
h is a natural number.

10. The display device of claim 9, wherein
the protruding portions extend in a first diagonal direction or a second diagonal direction,
the first diagonal direction intersects the first direction and the second direction on a plane defined by the first direction and the second direction, and
the second diagonal direction intersects the first direction and the second direction and the first diagonal direction on the plane.

11. The display device of claim 10, wherein the protruding portions disposed in the h-th column and the protruding portions disposed in the (h+1)th column extend in one of the first diagonal direction and the second diagonal direction.

12. The display device of claim 10, wherein
the protruding portions disposed in the h-th column extend in the first diagonal direction, and
the protruding portions disposed in the (h+1)th column extend in the second diagonal direction.

13. The display device of claim 1, wherein the signal pad comprises a first electrode disposed on the protruding portions.

14. The display device of claim 13, wherein the signal pad further comprises a second electrode disposed on the first electrode.

15. The display device of claim 1, wherein,
the protruding portions partially overlap the signal pad,
the signal pad covers a side surface of each of the protruding portions and a portion of an upper surface of each of the protruding portions, and
the side surface of each of the protruding portions is disposed adjacent to the pad part in a plan view.

16. The display device of claim 15, wherein another side surface of each of the protruding portions opposite to the side surface of each of the protruding portions, is exposed outside of the signal pad.

17. The display device of claim 1, wherein the protruding portions comprise an organic insulating layer.

18. A display device comprising:

a substrate;

a pixel disposed on the substrate;

a signal line comprising a line part electrically connected to the pixel and extending in a first direction and a pad part extending from an end of the line part to the first direction and having a width greater than a width of the line part;

a signal pad disposed on the pad part; and protruding portions disposed between the signal pad and the pad part and protruding upward, wherein the protruding portions are disposed in the first direction along edges of both sides of the pad part, which are opposite to each other in a second direction intersecting the first direction, and the protruding portions overlapping one side of the both sides of the pad part are spaced apart from and staggered with respect to the protruding portions overlapping another side of the both sides of the pad part in a plan view.

19. The display device of claim 18, wherein the protruding portions overlap the signal pad, and the signal pad covers the protruding portions in a plan view.

20. The display device of claim 18, wherein the protruding portions partially overlap the signal pad, the signal pad covers a side surface of each of the protruding portions and a portion of an upper surface of each of the protruding portions, and the side surface of each of the protruding portions is disposed adjacent to the pad part.

* * * * *